US012622081B2

(12) United States Patent
Sakamoto

(10) Patent No.: US 12,622,081 B2
(45) Date of Patent: May 5, 2026

(54) SENSOR DEVICE AND ELECTRONIC APPARATUS

(71) Applicant: SONY SEMICONDUCTOR SOLUTIONS CORPORATION, Kanagawa (JP)

(72) Inventor: Akihisa Sakamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 513 days.

(21) Appl. No.: 18/041,384

(22) PCT Filed: Aug. 11, 2021

(86) PCT No.: PCT/JP2021/029622
§ 371 (c)(1),
(2) Date: Feb. 10, 2023

(87) PCT Pub. No.: WO2022/044804
PCT Pub. Date: Mar. 3, 2022

(65) Prior Publication Data
US 2023/0299110 A1      Sep. 21, 2023

(30) Foreign Application Priority Data

Aug. 24, 2020    (JP) ................................. 2020-141235

(51) Int. Cl.
*H10F 39/00* (2025.01)
*H01L 25/065* (2023.01)
*H10W 90/00* (2026.01)

(52) U.S. Cl.
CPC ......... *H10F 39/809* (2025.01); *H10F 39/026* (2025.01); *H10F 39/8053* (2025.01); *H10W 90/00* (2026.01)

(58) Field of Classification Search
CPC .. H10F 39/809; H10F 39/026; H10F 39/8053; H01L 25/0657
See application file for complete search history.

(56) References Cited

U.S. PATENT DOCUMENTS

| | | | | |
|---|---|---|---|---|
| 2012/0044415 A1* | 2/2012 | Tsuduki | ................ | H10F 39/804 348/374 |
| 2012/0086094 A1* | 4/2012 | Watanabe | ............. | H01L 23/481 257/E31.127 |

FOREIGN PATENT DOCUMENTS

| | | |
|---|---|---|
| JP | 2009-038266 | 2/2009 |
| JP | 2011-018710 | 1/2011 |

(Continued)

OTHER PUBLICATIONS

International Search Report and Written Opinion prepared by the Japan Patent Office on Oct. 21, 2021, for International Application No. PCT/JP2021/029622, 2 pgs.

*Primary Examiner* — Timor Karimy
(74) *Attorney, Agent, or Firm* — SHERIDAN ROSS P.C.

(57) ABSTRACT

There are provided a sensor device and an electronic apparatus that are capable of reducing the occurrence of defects. The sensor device includes: a first substrate; a second substrate provided on a side of one surface of the first substrate; an insulating first film that is provided on the side of the one surface and covers the second substrate; and a second film that is formed of a material different from that of the first film and provided at a position facing the first substrate across the first film. The second substrate and the first film are intermixed in a first layer and the first film and the second film are intermixed in a second layer. The second film is present outside the second substrate in plan view from a direction normal to the one surface.

17 Claims, 22 Drawing Sheets

(56)     References Cited

FOREIGN PATENT DOCUMENTS

| JP | 2012-160572 | 8/2012 |
| JP | 2020-053654 | 4/2020 |
| WO | WO 2019/087764 | 5/2019 |

* cited by examiner 3 (Detection result: non-defective product)

2' (Detection result: non-defective product)

W

SENSOR DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2021/029622, having an international filing date of 11 Aug. 2021, which designated the United States, which PCT application claimed the benefit of Japanese Patent Application No. 2020-141235, filed 24 Aug. 2020, the entire disclosures of each of which are incorporated herein by reference.

TECHNICAL FIELD

The present disclosure relates to a sensor device and an electronic apparatus.

BACKGROUND ART

A CoW (Chip on Wafer) in which a semiconductor chip is bonded to the surface of a wafer is known. For example, Patent Literature 1 discloses a method of producing an imaging device, which is a technology in which a logic chip including a logic circuit determined to be a non-defective product is bonded to the surface of a wafer, an insulating film is deposited on the surface of the wafer, and then the surface of the insulating film is flattened.

CITATION LIST

Patent Literature

Patent Literature 1: WO 2019/087764
Patent Literature 2: Japanese Patent Application Laid-open No. 2011-18710

DISCLOSURE OF INVENTION

Technical Problem

In the CoW, a step corresponding to the thickness of the semiconductor chip is generated between the semiconductor chip and the wafer surface. The thickness is approximately 10 μm to 200 μm even in the case where the semiconductor chip is thinned, so that the step described above is large. When an insulating film is deposited on the surface of the wafer so as to cover the semiconductor chip, recesses and projections reflecting the step between the semiconductor chip and the wafer surface are formed on the surface of the insulating film. In order to flatten the recesses and projections, CMP (Chemical Mechanical Polishing) processing is performed on the surface of the insulating film. However, the recesses and projections described above reflect the step between the semiconductor chip and the wafer surface, and the step is large, i.e., approximately 10 μm to 200 μm. For this reason, even in the case where CMP processing is performed, there is a possibility that the surface of the insulating film is not sufficiently flattened. For example, there is a possibility that a depression called a void or dishing occurs between a plurality of semiconductor chips bonded to the surface of the wafer or the outer periphery portion of the wafer. There is a possibility that poor bonding occurs between the insulating film and another substrate (e.g., support substrate) due to this depression.

Further, stress is generated in the semiconductor chip due to the difference in coefficient of thermal expansion between the semiconductor chip and the insulating film. When this stress is large, there is a possibility that a load is applied to a transistor mounted on the semiconductor chip and the transistor characteristics (e.g., mobility) change. Further, when this stress is large, there is a possibility that positional deviation occurs between the semiconductor chip and a color filter provided on the insulating film covering the semiconductor chip. Regarding the semiconductor chip, there is a possibility that when the transistor characteristics change or positional deviation occurs between the semiconductor chip and the color filter, characteristics of the imaging device deteriorates.

Note that Patent Literature 2 discloses a technology in which a conducive pattern is formed on a semiconductor substrate, a first polishing stop layer is formed on the conducive pattern, an interlayer insulating film is formed on the semiconductor substrate so as to cover the conducive pattern and the first polishing stop layer, a second polishing stop layer is formed on the interlayer insulating film, and then the first polishing stop layer and the interlayer insulating film located above the conducive pattern are polished to flatten the upper surface of the semiconductor substrate. However, the technology disclosed in Patent Literature 2 does not flatten a large step between a semiconductor chip and a wafer, which is generated in a CoW. The technology disclosed in Patent Literature 2 flattens a small step in a semiconductor chip, which is generated in a pre-process of a semiconductor process. The thickness of the conducive pattern (wiring layer) in the semiconductor chip is assumed to be less than 1 μm at maximum, which is much smaller than a step (approximately 10 μm to 200 μm) generated in a CoW. Patent Literature 2 does not describe improvement in the flatness of the insulating film covering the semiconductor chip and relaxation of stress generated in the semiconductor chip.

The present disclosure has been made in view of such circumstances, and an object of the present disclosure is to provide a sensor device and an electronic apparatus that are capable of reducing the occurrence of defects.

Solution to Problem

A sensor device according to an aspect of the present disclosure includes: a first substrate; a second substrate provided on a side of one surface of the first substrate; an insulating first film that is provided on the side of the one surface and covers the second substrate; and a second film that is formed of a material different from that of the first film and provided at a position facing the first substrate across the first film. The second substrate and the first film are intermixed in a first layer, and the first film and the second film are intermixed in a second layer. The second film is present outside the second substrate in plan view from a direction normal to the one surface.

In accordance with this, when producing the sensor device, the first film can be polished using the second film as a stopper layer. As a result, it is possible to flatten the second layer in which the first film and the second film are intermixed while preventing a depression called a void or dishing from occurring in the first film. As a result, it is possible to reduce the occurrence of defects (e.g., the occurrence of poor bonding between the second layer and the support substrate).

Further, the second film shrinks due to cooling after deposition. This shrinkage generates inward stress in the second film. Further, a reaction force to the stress generated in the second film is generated in the first film that is in contact with the second film. This reaction force relaxes the stress generated in the second substrate. As a result, for example, it is possible to prevent transistor characteristics (e.g., mobility) from changing due to a load applied to a transistor mounted on the second substrate and positional deviation between the second substrate and the color filter on the second layer covering the second substrate from occurring. It is possible to reduce the occurrence of defects due to the changes in characteristics and positional deviation.

An electronic apparatus according to an aspect of the present disclosure includes: an optical part; and the sensor device described above, light that has been transmitted through the optical part entering the sensor device.

In accordance with this, since the sensor device described above is applied, it is possible to provide an electronic apparatus capable of reducing the occurrence of defects.

MODE(S) FOR CARRYING OUT THE INVENTION

Hereinafter, embodiments of the present disclosure will be described with reference to the drawings. In the description of the drawings referred to in the following description, the same or similar portions are denoted by the same or similar reference symbols. Note that, however, the drawings are schematic, and the relationship between the thickness and the plane dimensions, the ratio of the thickness of each layer, or the like, is different from the actual one. Therefore, the specific thickness and dimensions should be determined by referring to the following description. Further, it goes without saying that the drawings also include portions having different dimensional relationships and ratios from each other.

Definitions of directions such as up and down in the following description are merely definitions for convenience of description and do not limit the technical idea of the present disclosure. For example, it goes without saying that the up and down are converted into the right and left and interpreted when an object is observed after being rotated by 90° and the up and down are reversed and interpreted when an object is observed after being rotated by 180°.

In the following description, directions are described using the terms X-axis direction, Y-axis direction, and Z-axis direction in some cases. For example, the X-axis direction and the Y-axis direction are direction parallel to one surface $2a$ of a CIS substrate 2. The X-axis direction and the Y-axis direction are referred to also as horizontal directions. The Z-axis direction is a direction perpendicular to the one surface $2a$. The X-axis direction, the Y-axis direction, and the Z-axis direction are orthogonal to each other.

In the following description, the term "in plan view" means viewing from a direction normal to the one surface $2a$ of the CIS substrate 2 (e.g., Z-axis direction).

First Embodiment

Figure 1:
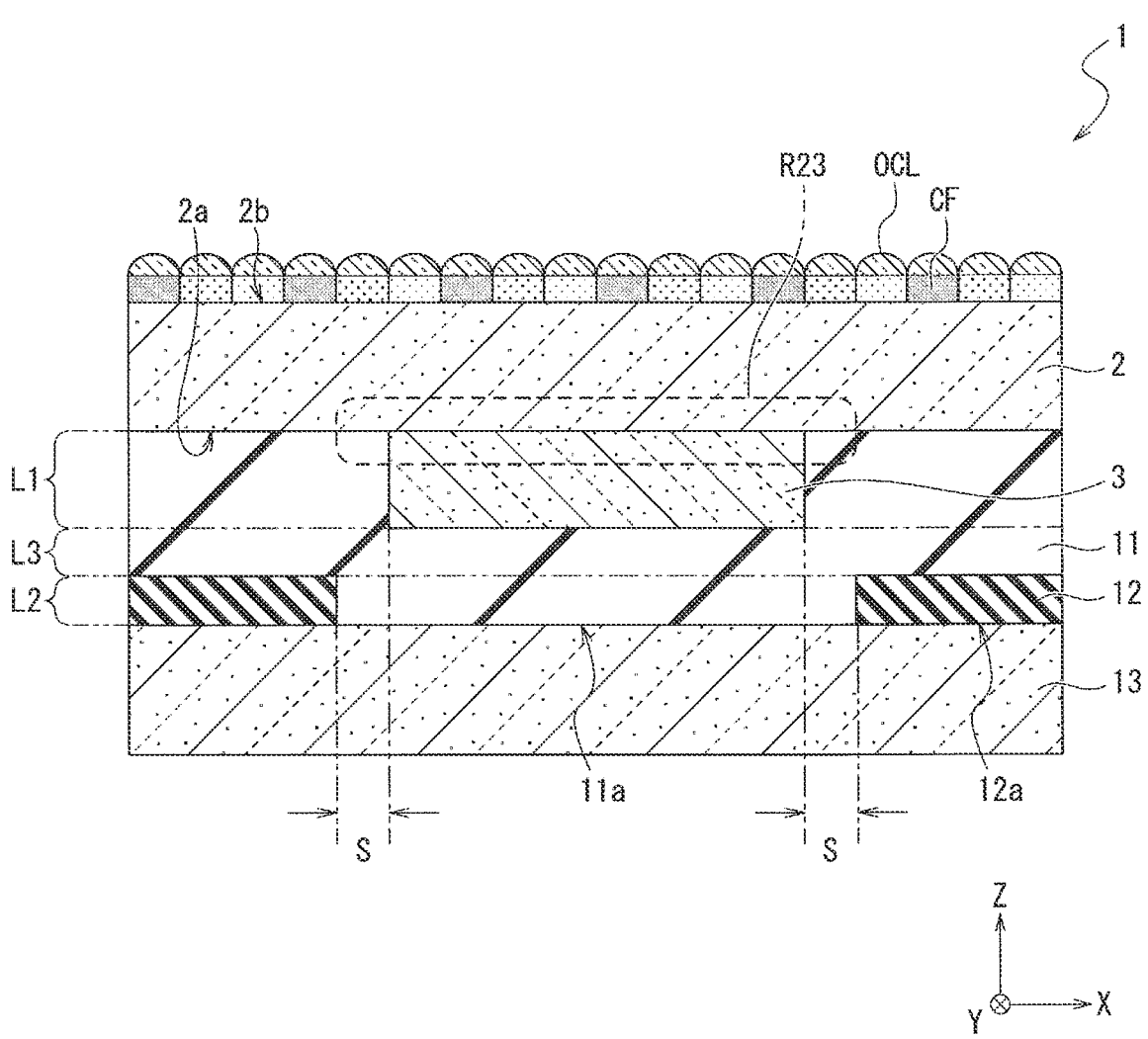
FIG. 1 is a cross-sectional view showing a configuration example of an imaging device according to a first embodiment of the present disclosure.

FIG. 1 is a cross-sectional view showing a configuration example of an imaging device 1 according to a first embodiment of the present disclosure. As shown in FIG. 1, the imaging device 1 according to the first embodiment (an example of a "sensor device" according to the present disclosure) includes the CIS substrate 2 (an example of a "first substrate" according to the present disclosure), a logic chip 3 (an example of a "second substrate" according to the present disclosure) provided on the side of the one surface 2a (lower surface in FIG. 1) of the CIS substrate 2, a first insulating film 11 (an example of a "first film" according to the present disclosure) that is provided on the side of the one surface 2a of the CIS substrate 2 and covers the logic chip 3, a second insulating film 12 (an example of a "second film" according to the present disclosure) that faces the CIS substrate 2 across the first insulating film 11, a support substrate 13 that is provided at a position facing the CIS substrate 2 across the first insulating film 11 and the second insulating film 12 and is contact with the first insulating film 11 and the second insulating film 12, a color filter CF provided on the side of the other surface 2b (upper surface in FIG. 1) that is the opposite side of the one surface 2a of the CIS substrate 2, and an on-chip lens OCL provided at a position facing the CIS substrate 2 across the color filter CF.

The imaging device 1 includes a first layer L1, a second layer L2, and a third layer L3 between the CIS substrate 2 and the support substrate 13. The first layer L1 is a layer in which the logic chip 3 and the first insulating film 11 are intermixed. The second layer L2 is a layer in which the first insulating film 11 and the second insulating film 12 are intermixed. The third layer L3 is located between the first layer L1 and the second layer L2 and is a layer including only the first insulating film 11. The thickness of the first layer L1 is, for example, 10 μm or more and 200 μm or less. The thickness of the second layer L2 is, for example, 10 μm or less. The thickness of the third layer L3 is, for example, 0.1 μm or more and 100 μm or less.

The CIS substrate 2 is a substrate on which a CMOS (Complementary Metal Oxide Semiconductor) image sensor is formed. The CMOS image sensor includes, for example, a plurality of photodiodes and a readout circuit for reading electrical signals obtained by photoelectric conversion in the photodiodes.

The logic chip 3 is a semiconductor chip in which a logic circuit is formed. The logic chip 3 is electrically connected to the CIS substrate 2. The logic circuit of the logic chip 3 performs various types of signal processing regarding operations of the imaging device 1, such as performing predetermined processing on the electrical signal output from the CIS substrate 2. Note that not only the logic chip 3 but also the CIS substrate 2 may include a circuit for performing signal processing regarding the operations of the imaging device 1.

Figure 2:
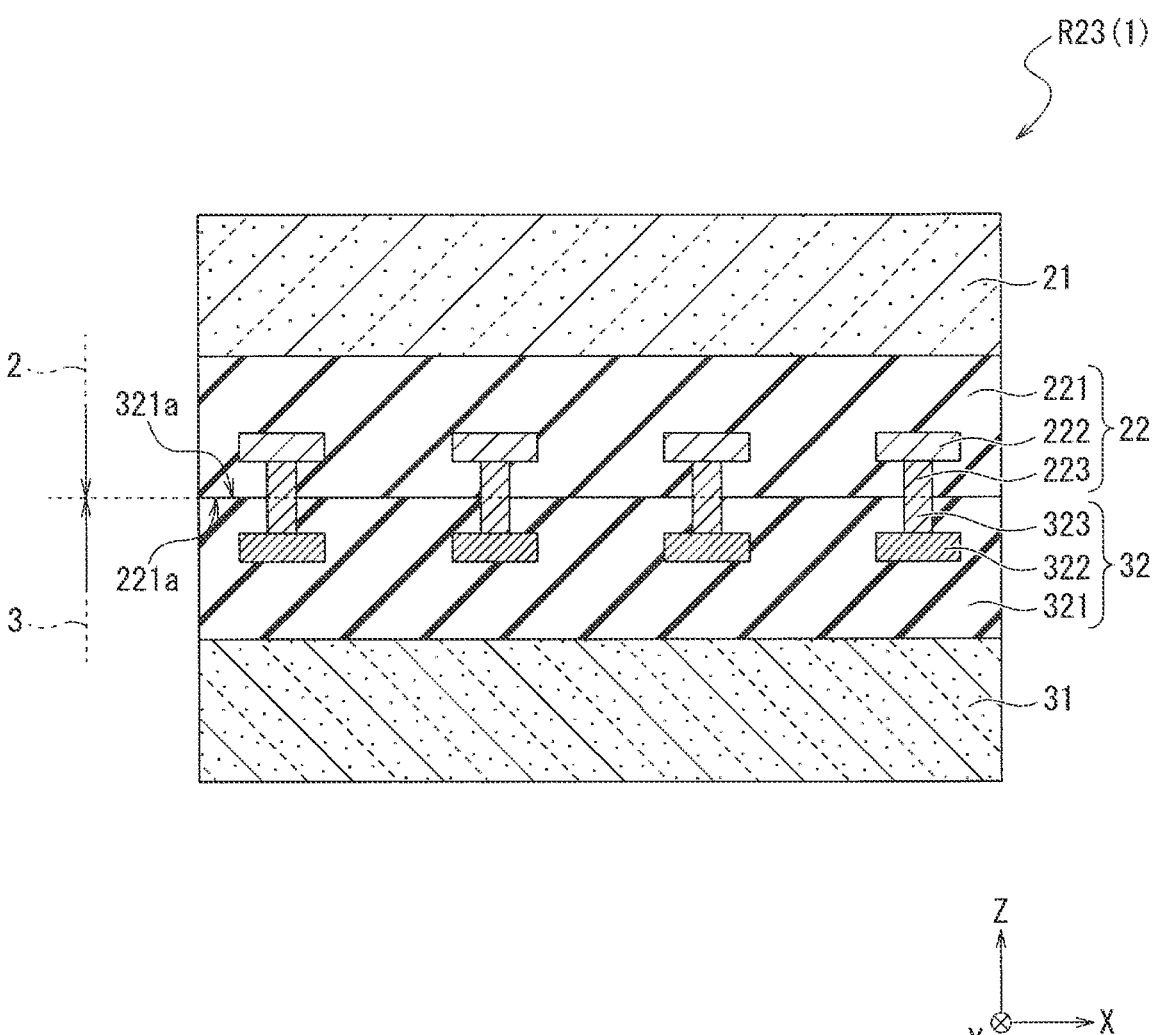
FIG. 2 is a cross-sectional view showing an enlarged part of a bonding region between a Complementary Metal Oxide Semiconductor (CMOS) Image Sensor (CIS) substrate and a logic substrate in the imaging device according to the first embodiment of the present disclosure.

FIG. 2 is a cross-sectional view showing an enlarged part of a bonding region R23 between the CIS substrate 2 and the logic chip 3 in the imaging device according to the first embodiment of the present disclosure. As shown in FIG. 2, the CIS substrate 2 includes a substrate portion 21 formed of a semiconductor such as silicon (Si) and a wiring portion 22 provided on the surface (on the lower surface side in FIG. 2) of the substrate portion 21. The wiring portion 22 includes an insulating film 221, a wiring layer 222 provided inside the insulating film 221, and an electrode layer 223 that is connected to the wiring layer 222 and exposed to a surface 221a (lower surface in FIG. 2) of the insulating film 221. Although not shown, a plurality of wiring layers 222 may be provided in the thickness direction (e.g., Z-axis direction) of the insulating film 221. In this case, the electrode layer 223 may be connected to the wiring layer closest to the surface 221a, of the plurality of wiring layers 222.

The surface 221a of the insulating film 221 corresponds to, for example, the one surface 2a of the CIS substrate 2 shown in FIG. 1. The insulating film 221 includes, for example, a silicon oxide film (SiO$_2$ film), a silicon nitride film (SiN film), or a stacked film obtained by stacking a SiO$_2$ film and a SiN film. The wiring layer 222 is formed of, for example, aluminum (Al), an Al alloy containing Al as a main constituent, copper (Cu), or a Cu alloy containing Cu as a main constituent. The electrode layer 223 is formed of, for example, Cu or a Cu alloy containing Cu as a main constituent.

The logic chip 3 includes a substrate portion 31 formed of a semiconductor such as silicon (Si), and a wiring portion 32 provided on the side of the surface (upper surface in FIG. 2) of the substrate portion 31. The wiring portion 32 includes an insulating film 321, a wiring layer 322 provided inside the insulating film 321, and an electrode layer 323 that is connected to the wiring layer 322 and exposed to a surface 321a (upper surface in FIG. 2) of the insulating film 321. Although not shown, a plurality of wiring layers 322 may be provided in the thickness direction (e.g., Z-axis direction) of the insulating film 321. In this case, the electrode layer 323 may be connected to the wiring layer closest to the surface 321a, of the plurality of wiring layers 322.

The insulating film 321 includes, for example, a SiO$_2$ film, a SiN film, or a stacked film obtained by stacking a SiO$_2$ film and a SiN film. The wiring layer 322 is formed of, for example, Al, an Al alloy containing Al as a main constituent, Cu, or a Cu alloy containing Cu as a main constituent. The electrode layer 323 is formed of, for example, Cu or a Cu alloy containing Cu as a main constituent.

As shown in FIG. 1 and FIG. 2, in the bonding region R23, the insulating films 221 and 321 are bonded in close contact with each other. Further, also the electrode layers 223 and 323 are bonded (e.g., Cu—Cu bonding) in close contact with each other. As a result, the CIS substrate 2 and the logic chip 3 are integrated with each other and the wiring layers 222 and 322 are electricity connected to each other via the electrode layers 223 and 323.

The first insulating film 11 shown in FIG. 1 is formed of a material having a coefficient of thermal expansion smaller than that of the semiconductor (e.g., Si) forming the substrate portion 31 of the logic chip 3 and includes, for example, a SiO$_2$ film.

The second insulating film 12 is formed of a material having a composition different from that of the first insulating film 11. The second insulating film 12 is favorably formed of a material having a coefficient of thermal expansion larger than that of the semiconductor (e.g., Si) forming the substrate portion 31 of the logic chip 3. Further, the second insulating film 12 is favorably formed of a material having a coefficient of thermal expansion smaller than that of the first insulating film 11. For example, the second insulating film 12 includes an aluminum oxide (Al$_2$O$_3$), silicon carbide (SiC), aluminum nitride (AlN), or SiN film, or a stacked film including at least one of these. Table 1 shows approximate values of coefficients of thermal expansion (CTE) of these materials. In Table 1, "to 3" means 3 or less.

TABLE 1

| Material | Coefficient of thermal expansion(CTE)[ppm/K] |
|---|---|
| Si | 2.4 |
| SiO$_2$ | 1.4 |
| Cu | 16.8 |

TABLE 1-continued

| Material | Coefficient of thermal expansion(CTE)[ppm/K] |
|---|---|
| $Al_2O_3$ | 9 |
| SiC | 6.6 |
| AlN | 5 |
| SiN | to 3 |

As shown in FIG. 1, a surface 11*a* (lower surface in FIG. 1) of the first insulating film 11 and a surface 12*a* (lower surface in FIG. 1) of the second insulating film 12 are flush or substantially flush. The surface 11*a* of the first insulating film 11 and the second insulating film 12 are flattened and a step between the surfaces 11*a* and 21*a* is zero (0) or substantially zero. The surface 11*a* of the first insulating film 11 and the surface 12*a* of the second insulating film 12 are each in contact with the support substrate 13. The support substrate 13 includes, for example, a Si substrate covered with a $SiO_2$ film.

Figure 3:
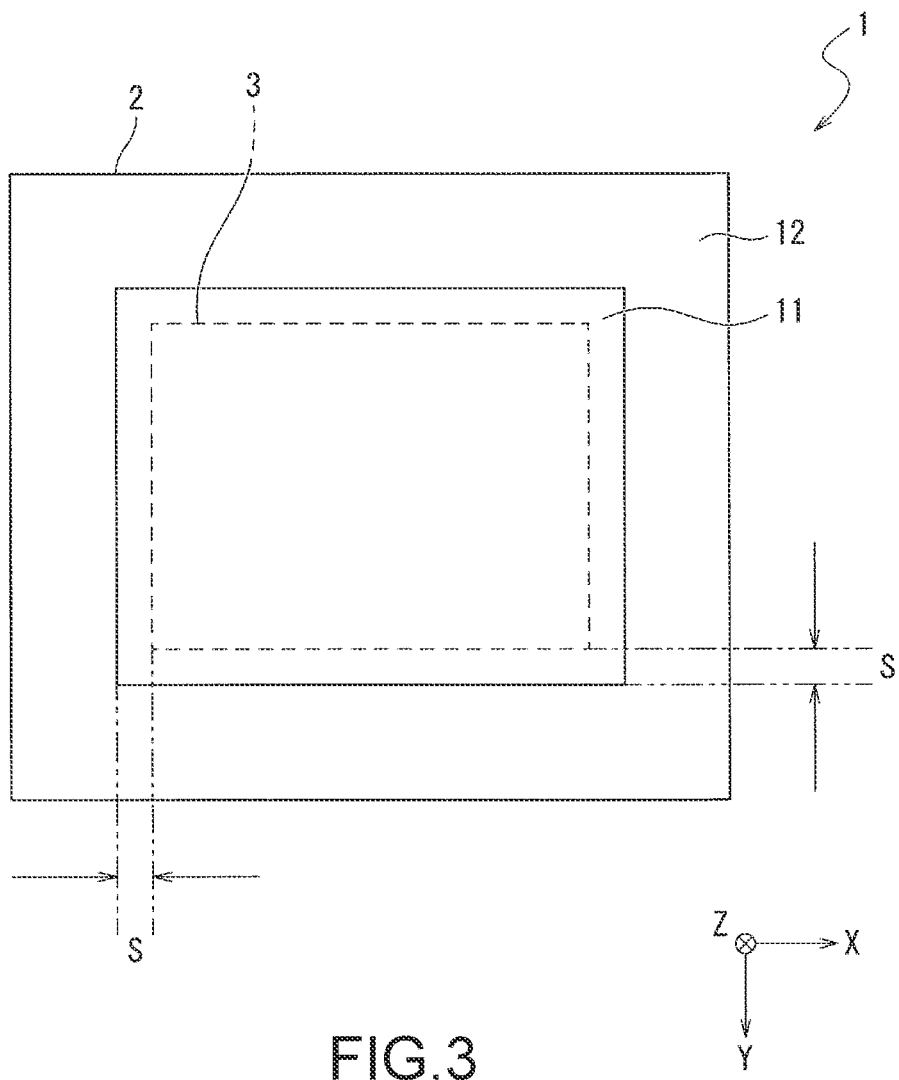
FIG. 3 is a plan view of a first insulating film and a second insulating film of the imaging device according to the first embodiment of the present disclosure as viewed from the side of a support substrate.

FIG. 3 is a plan view of the first insulating film 11 and the second insulating film 12 of the imaging device 1 according to the first embodiment of the present disclosure as viewed from the side of the support substrate 13. As shown in FIG. 3, the first insulating film 11 is disposed so as to cover the entire region of the logic chip 3 in plan view. Further, the second insulating film 12 is disposed outside the logic chip 3 (that is, a region not overlapping the logic chip 3) in plan view. The second insulating film 12 is not present in a region overlapping the logic chip 3 in plan view. The second insulating film 12 and the logic chip 3 are spaced apart from each other by a distance S and the second insulating film 12 is disposed so as to cover the logic chip 3 in plan view. The distance S is, for example, 0.1 μm or more and 300 μm or less.

(Production method) Next, an example of a method of producing the imaging device 1 according to the first embodiment of the present disclosure will be described. The imaging device 1 is produced using various devices such as
    a deposition device (including a CVD (Chemical Vapor Deposition) device and a coating device), an exposure device, an etching apparatus, a CMP (Chemical Mechanical Polishing) device, a grinder device, a bonding device, and a dicing device. Hereinafter, these devices will be collectively referred to as a production device.

Figure 4:
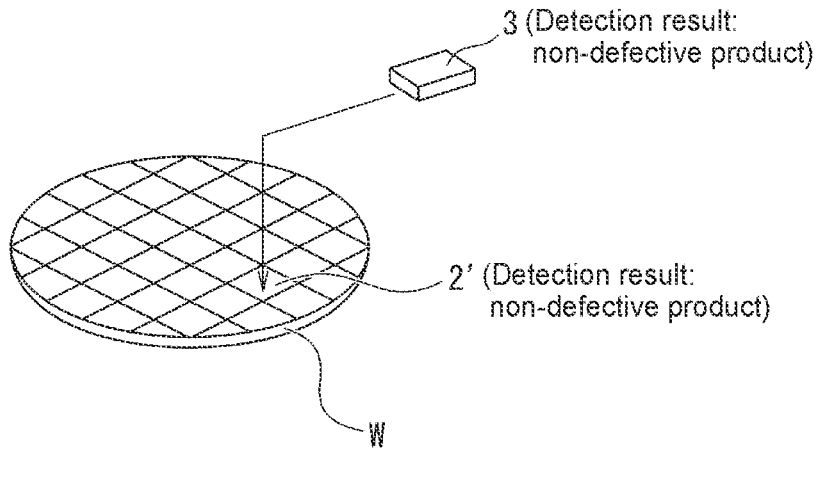
FIG. 4 is a diagram schematically showing a CoW applicable to a method of producing the imaging device according to the first embodiment of the present disclosure.
Figure 5:
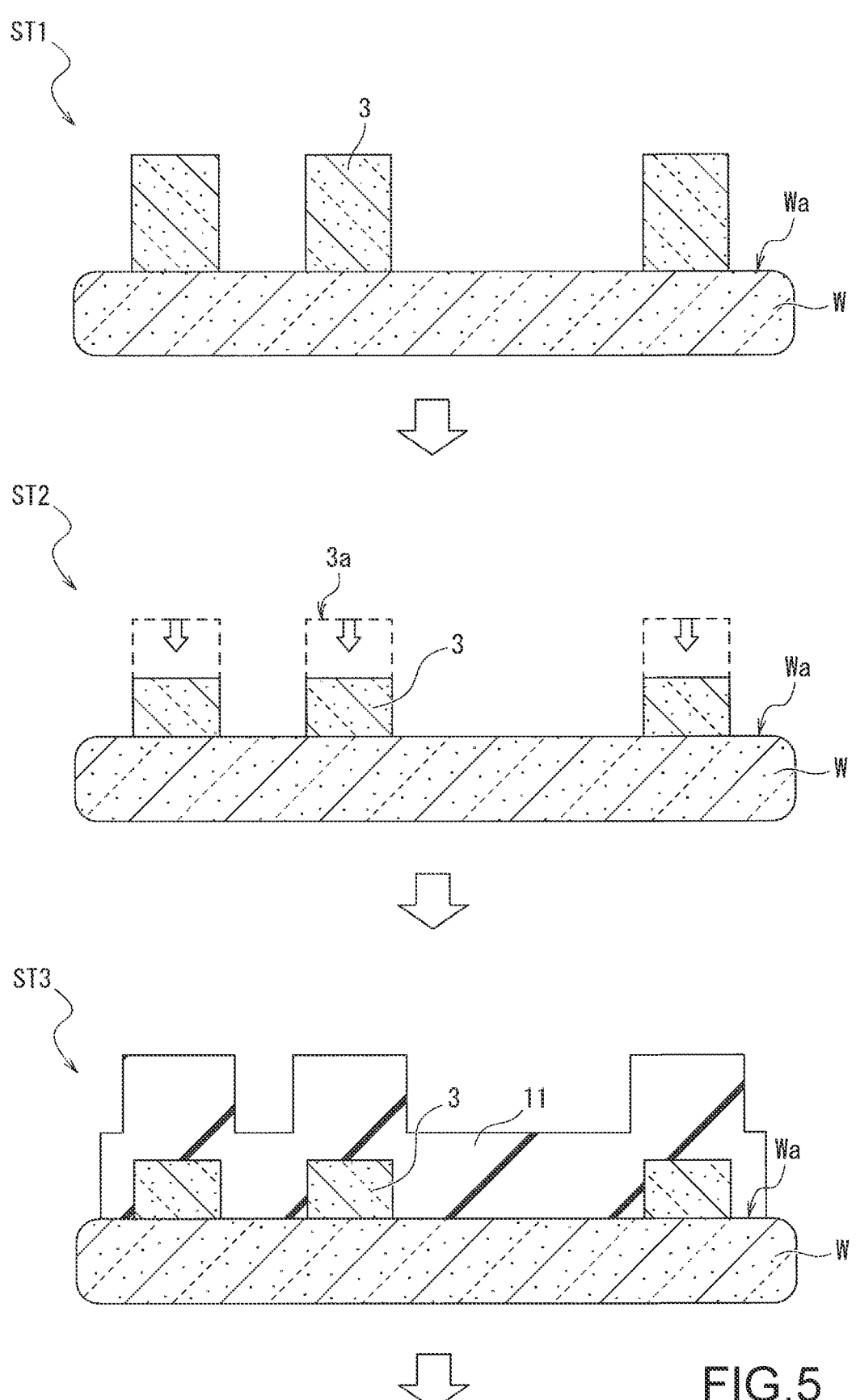
FIG. 5 is a cross-sectional view showing the method of producing the imaging device according to the first embodiment of the present disclosure in order of steps.
Figure 6:
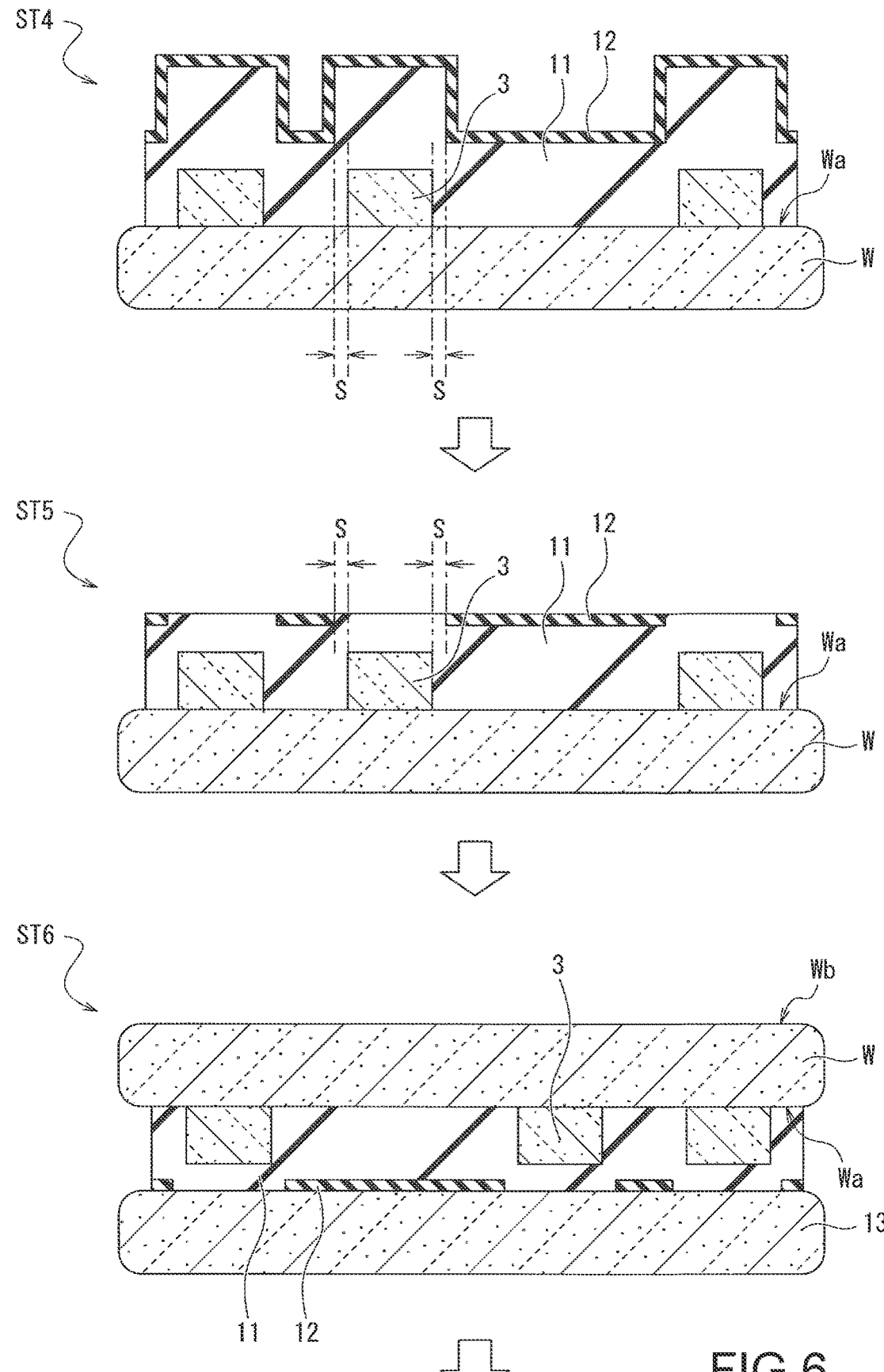
FIG. 6 is a cross-sectional view showing the method of producing the imaging device according to the first embodiment of the present disclosure in order of steps.
Figure 7:
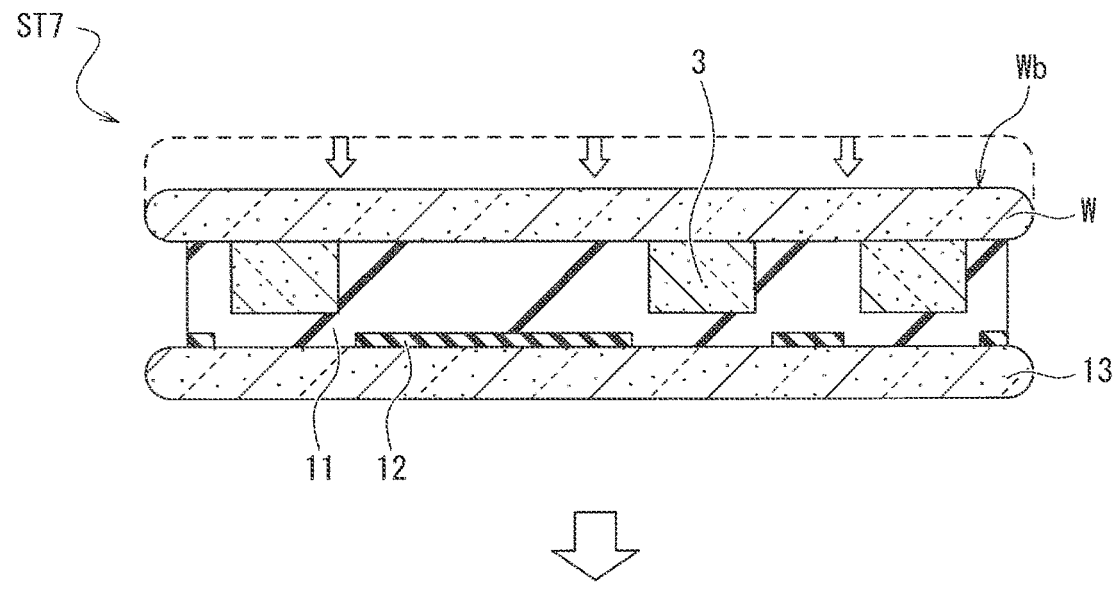
FIG. 7 is a cross-sectional view showing the method of producing the imaging device according to the first embodiment of the present disclosure in order of steps.
Figure 7:
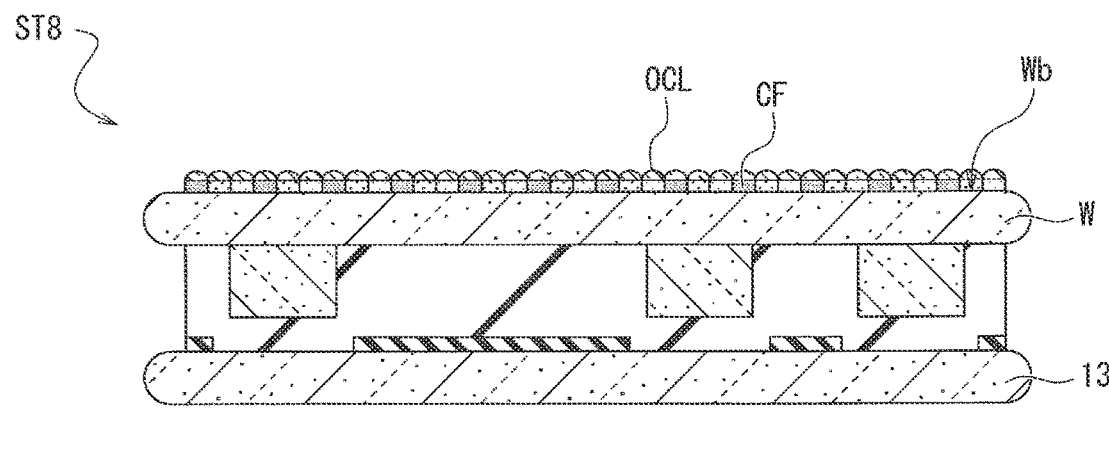
Figure 7:
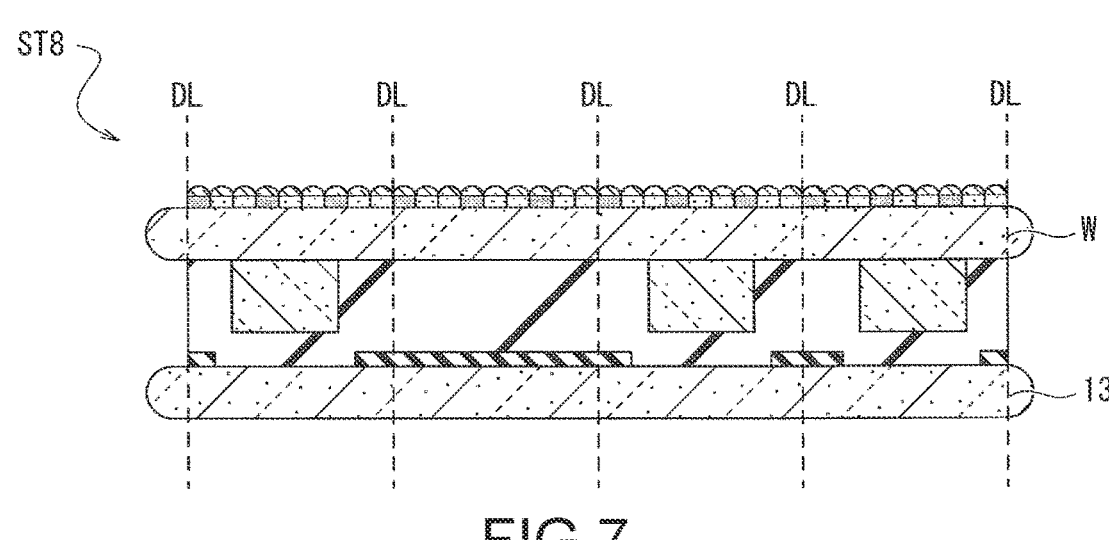

FIG. 4 is a diagram schematically showing a CoW applicable to the method of producing the imaging device 1 according to the first embodiment of the present disclosure. FIG. 5 to FIG. 7 are each a cross-sectional view showing the method of producing the imaging device 1 according to the first embodiment of the present disclosure in order of steps. As shown in Step ST1 in FIG. 5, the production device bonds the logic chip 3 to the CIS substrate 2 on which a CMOS image sensor is formed. This bonding is performed by a CoW (Chip on Wafer).

For example, as shown in FIG. 4, the production device produces a wafer W on which a plurality of CMOS image sensors 2' is formed and performs a probe inspection or the like on the plurality of CMOS image sensors 2' formed on the wafer W to perform determination of a non-defective product or a defective product for each CMOS image sensor. Further, before or after this step, the production device produces a wafer (not shown) on which a plurality of logic circuits is formed and performs a probe inspection or the like on the plurality of logic circuits formed on this wafer to perform determination of a non-defective product or a defective product for each logic circuit. Next, the production device divides the wafer on which the plurality of logic circuit is formed into pieces for each logic circuit to form a plurality of logic chips 3. After that, the production device bonds the logic chip 3 that has been determined to be a non-defective product and divided into pieces to the CMOS image sensor 2' that has been determined to be a non-defective product in the wafer W. The production device performs bonding by a CoW in this way.

In bonding by a CoW, non-defective products are bonded to each other. Since it is possible to prevent the logic chip 3 determined to be a non-defective product from being bonded to the CMOS image sensor 2' determined to be a defective product and prevent the logic chip 3 determined to be a defective product from being bonded to the CMOS image sensor 2' determined to be a non-defective product, it is possible to reduce the production cost of the imaging device 1.

Next, as shown in Step ST2 in FIG. 5, the production device grinds a surface 3*a* (upper surface in FIG. 5) of the logic chip 3 to thin the logic chip 3 (reduce the thickness). Next, as shown in Step ST3 in FIG. 5, the production device deposits the first insulating film 11 on the wafer W on the side of one surface Wa by a CVD method to cover the plurality of logic chips 3 and fill the spaces between the logic chips 3 adjacent to each other. Next, as shown in Step ST4 in FIG. 6, the production device deposits the second insulating film 12 on the first insulating film 11 by a CVD method. Since deposition is performed reflecting the shape of the underlying layer in a CVD method, the first insulating film 11 and the second insulating film 12 are formed in a recessed and projecting shape. In the wafer W, the first insulating film 11 and the second insulating film 12 are formed in a projecting shape in a region where the logic chip 3 is disposed, and the first insulating film 11 and the second insulating film 12 are formed in a recessed shape in a region where the logic chip 3 is not disposed.

Next, as shown in Step ST5 in FIG. 6, the production device performs CMP processing on the second insulating film 12 and the first insulating film 11 from the side of the second insulating film 12 to flatten the side of the one surface Wa of the wafer W.

Figure 8:
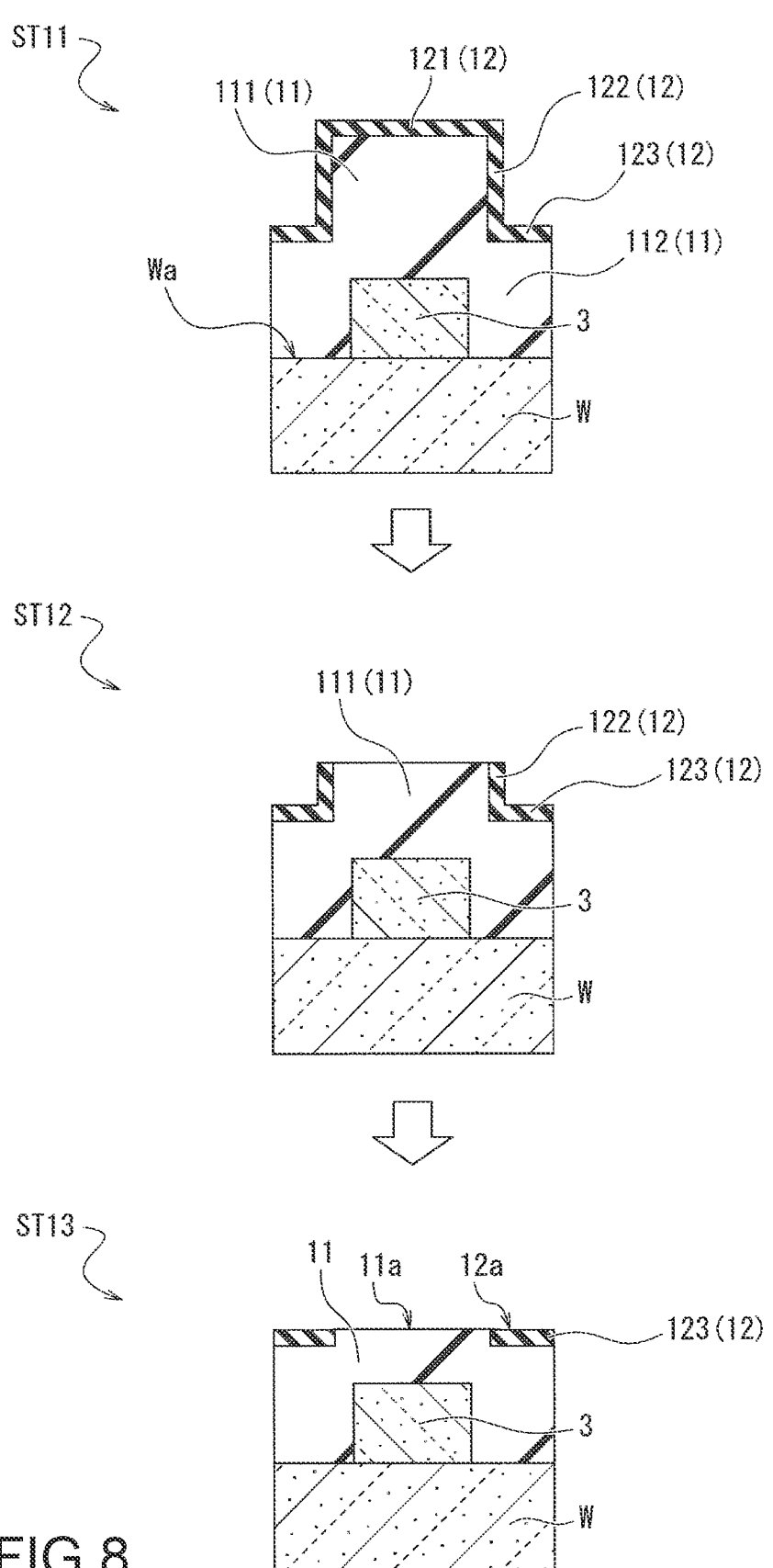
FIG. 8 is a cross-sectional view for describing a flattening step in more detail.

FIG. 8 is a cross-sectional view for describing a flattening step in more detail. As shown in Step ST11 in FIG. 8, the first insulating film 11 deposited by a CVD method includes a projecting portion 111 and a recessed portion 112. The projecting portion 111 is formed in a region where the logic chip 3 is disposed, and the recessed portion 112 is formed in a region where the logic chip 3 is not disposed. The second insulating film 12 includes a first plane portion 121 that covers the upper surface of the projecting portion 111 of the first insulating film 11, a side wall portion 122 that covers the side surface of the projecting portion 111, and a second plane portion 123 that covers the upper surface of the recessed portion 112.

In the CMP processing, the first plane portion 121 of the second insulating film 12 is polished first. The first plane portion 121 of the second insulating film 12 is located at the tip of the projecting portion 111 and the force applied from the polishing pad concentrates thereon in the initial stage of the CMP processing. For this reason, the first plane portion 121 is easily polished and is removed in the initial stage of the CMP processing.

As shown in Step ST12 in FIG. 8, when the first plane portion 121 is removed by polishing and the projecting portion 111 of the first insulating film 11 is exposed, the projecting portion 111 of the first insulating film 11 and the side wall portion 122 of the second insulating film 12 are polished. At this stage, the side wall portion 122 of the second insulating film 12 serves as a guide (protective film) that suppresses the progress of polishing. The side wall portion 122 prevents the corners of the projecting portion 111 from being excessively polished.

As shown in Step ST13 in FIG. 8, when the side wall portion 122 is removed by polishing, the projecting portion 111 of the first insulating film 11 and the second plane portion 123 of the second insulating film 12 are polished. When the CMP processing progresses to the second plane portion 123, the surface 11a of the first insulating film 11 and the surface 12a of the second insulating film 12 are flush and flattened.

The second insulating film 12 is formed of a material having a polishing rate by CMP processing lower than that of the first insulating film 11. For example, the first insulating film 11 is formed of $SiO_2$ and the second insulating film 12 is formed of $Al_2O_3$, SiC, AlN, SiN, or Si. As a result, the second plane portion 123 of the second insulating film 12 functions as a stopper film for CMP processing on the first insulating film 11.

Note that as described above, the first insulating film 11 is formed reflecting the shape of the logic chip 3. As a result, the projecting portion 111 of the first insulating film 11 is formed in a shape swelling in the horizontal direction (X-axis direction and Y-axis direction) than the logic circuit 3. Since the second insulating film 12 is deposited on the first insulating film 11 by a CVD method, the side wall portion 122 and the second plane portion 123 of the second insulating film 12 are formed in a region not overlapping the logic circuit 3. For example, the second plane portion 123 is formed to be spaced apart from the logic chip 3 by the distance S. The distance S between the logic chip 3 and the second plane portion 123 remains after CMP processing.

Figure 9:
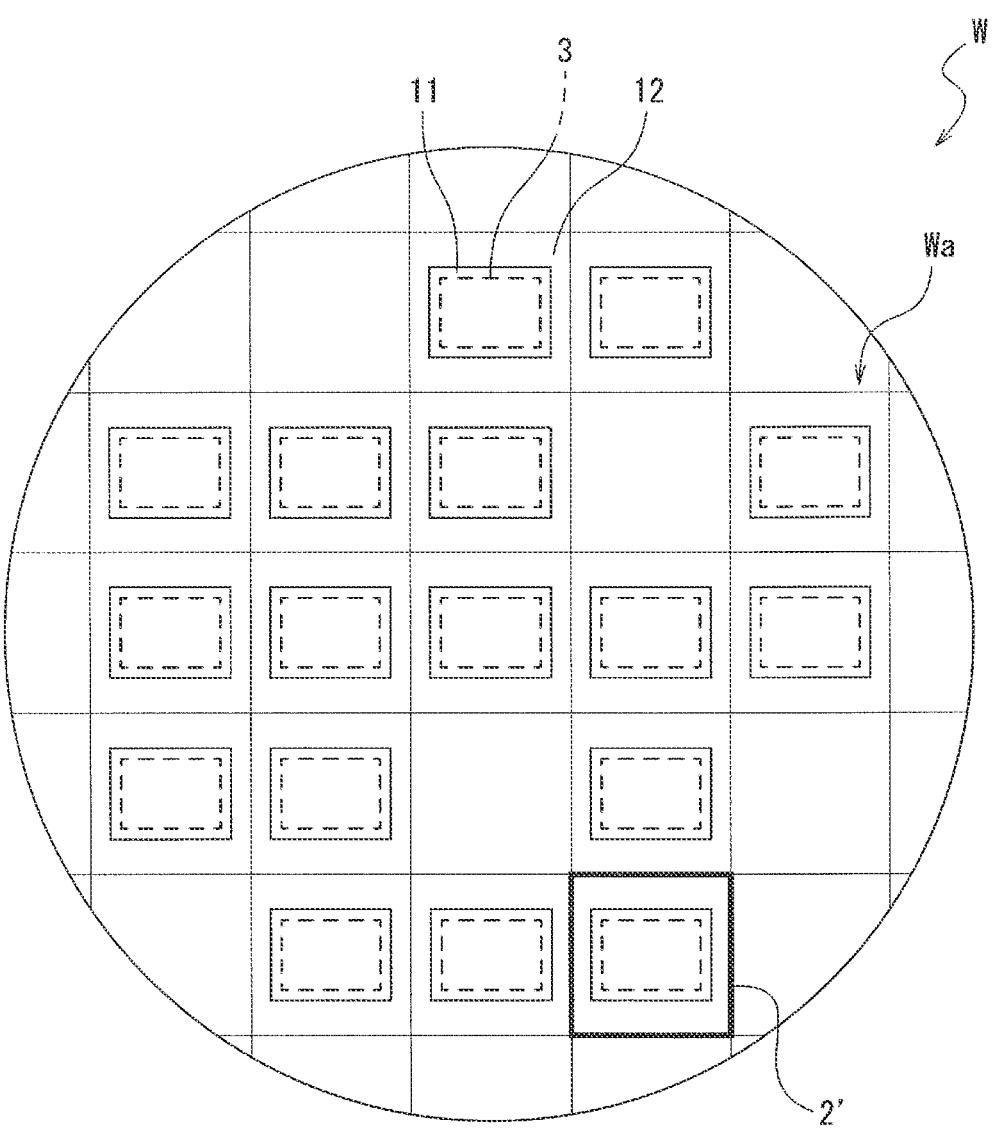
FIG. 9 is a plan view schematically showing the side of one surface of a wafer after Step ST5 (CMP processing) shown in FIG. 6 is performed.

FIG. 9 is a plan view schematically showing the side of the one surface Wa of the wafer W after Step ST5 (CMP processing) in FIG. 6 is performed. By the CMP processing, the second insulating film 12 is formed into a shape surrounding the logic chip 3 in plan view. Further, as shown in FIG. 3, the second insulating film 12 and the logic chip 3 are formed to be spaced apart from each other by the distance S in plan view.

Next, as shown in Step ST6 in FIG. 6, the production device bonds the support substrate 13 to the flattened first insulating film 11 and second insulating film 12. Note that in Step ST6 in FIG. 6 and subsequent Steps, the up and down is reversed with respect to Step ST5 in FIG. 6.

Next, as shown in Step ST7 in FIG. 7, the production device grinds the other surface Wb (upper surface in FIG. 7) of the wafer W to thin the wafer W.

Next, as shown in Step ST8 in FIG. 7, the production device forms the color filter CF on the side of the other surface Wb of the wafer W and attaches the on-chip lens OCL onto the color filter CF.

After that, as shown in Step ST9 in FIG. 7, the production device dices the wafer W and the support substrate 13 along a dicing line DL to divide them into pieces. In this step, the first layer L1, the second layer L2, and the third layer L3 (see FIG. 1) are also diced together with the wafer W and the support substrate 13. The imaging device 1 shown in FIG. 1 is completed through the above steps.

(Mechanism of Stress Relaxation)

In the step of producing the imaging device 1, since the second plane portion 123 of the second insulating film 12 is disposed on the recessed portion 112 of the first insulating film 11, it is possible to relax the stress generated in the logic chip 3.

Figure 10:
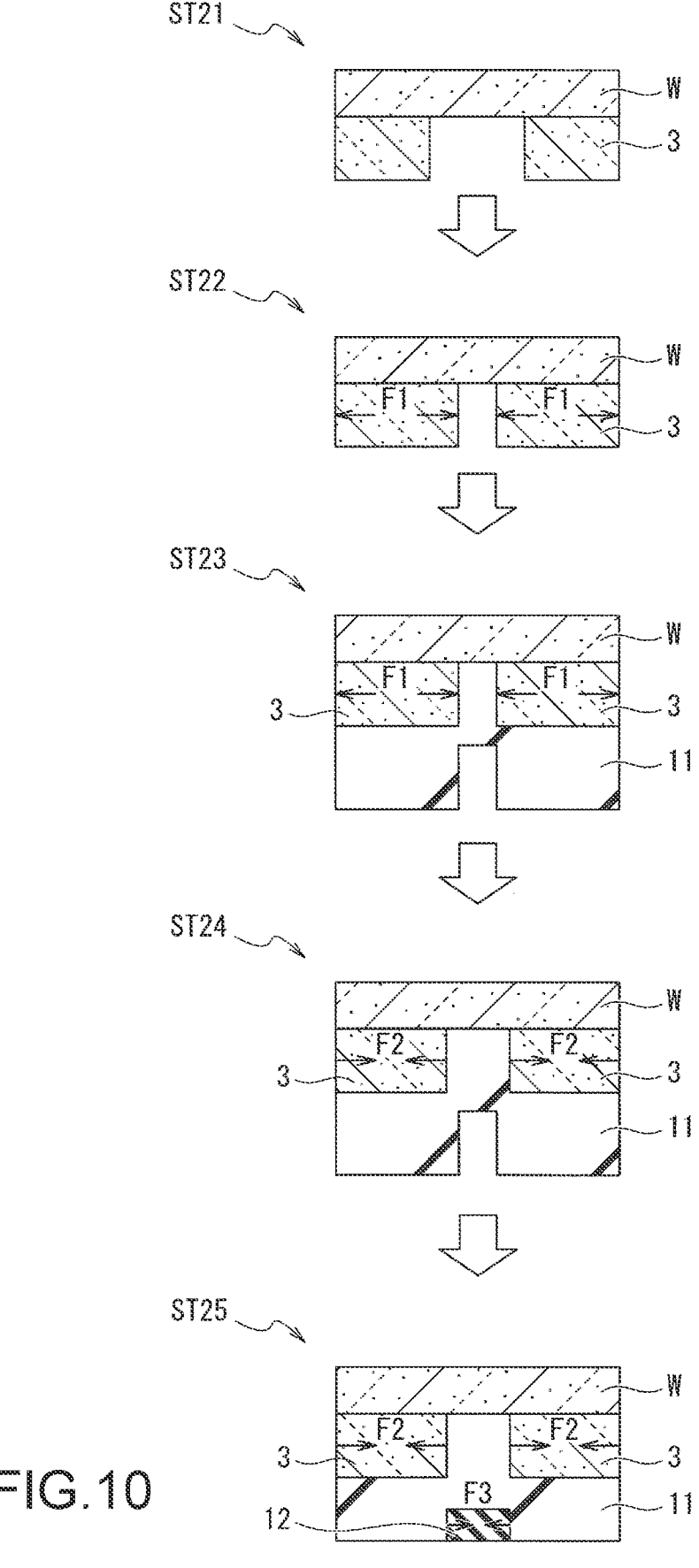
FIG. 10 is a diagram schematically showing the mechanism of stress relaxation of the imaging device according to the first embodiment of the present disclosure.

FIG. 10 is a diagram schematically showing a mechanism of stress relaxation in the imaging device 1 according to the first embodiment of the present disclosure. Step ST21 in FIG. 10 shows a state in which the logic chip 3 is bonded to the wafer W (room temperature: 25° C.). In the case where the first insulating film 11 is deposited by a CVD method in this state, the wafer W is heated before the deposition in advance. This heating raises the temperature of the wafer W and the logic chip 3 bonded to the wafer W to, for example, 350° C. Then, as shown in Step ST22 in FIG. 10, the logic chip 3 expands in accordance with the coefficient of thermal expansion of the material forming the logic chip 3. For example, the substrate portion 31 shown in FIG. 2 is formed of Si or the like, and the wiring portion 32 is formed of $SiO_2$, Cu, or the like. This expansion generates an outward stress F1 in the logic chip 3.

Step ST23 in FIG. 10 shows a state in which a first insulating film is deposited (350° C.). The logic chip 3 is fixed by the first insulating film 11 while being expanded. After depositing the first insulating film 11, the first insulating film 11, the wafer W, and the logic chip 3 are cooled to room temperature. This cooling causes the expanded logic chip 3 to shrink. As shown in Step ST24 in FIG. 10, This shrinkage generates an inward stress F2 in the logic chip 3.

Here, since the logic chip 3 is fixed from the periphery by the first insulating film 11, the logic chip 3 cannot sufficiently shrink. As a result, the inward stress F2 remains in the logic chip 3 even after cooling.

However, in the first embodiment of the present disclosure, the second insulating film 12 is deposited by a CVD method after depositing the first insulating film 11. Then, the second insulating film 12 is subjected to CMP processing. As a result, as shown in Step ST25 in FIG. 10, the second insulating film 12 is formed in a self-alignment manner so as to be present only between the logic chips 3.

Similarly to the first insulating film 11, also the second insulating film 12 shrinks due to cooling after deposition. This shrinkage generates an inward stress F3 in the second insulating film 12. Further, a reaction force to the stress F3 (force in the direction opposite to the stress F3) is generated in the first insulating film 11 that is in contact with the second insulating film 12. This reaction force to the stress F3 relaxes the stress F2 generated in the logic chip 3.

Meanwhile, in a Comparative Example of the present disclosure, Step ST25 is not performed and no second insulating film is formed. For this reason, in the Comparative Example, the stress F2 acting on a logic chip remains as it is without being relaxed.

Effect of First Embodiment

As described above, the imaging device 1 according to the embodiment of the present disclosure includes the CIS substrate 2, the logic chip 3 provided on the side of the one surface 2a of the CIS substrate 2, the first insulating film 11 that is provided on the side of the one surface 2a and covers the logic chip 3, and the second insulating film 12 that is formed of a material different from that of the first insulating film 11 and provided at a position facing the CIS substrate 2 across the first insulating film 11. The logic chip 3 and the first insulating film 11 are intermixed in the first layer L1, and the first insulating film 11 and the second insulating film 12 are intermixed in the second layer L2. The second insulating film 12 is present outside the logic chip 3 in plan view from a direction normal to the one surface 2a (e.g., Z-axis direction).

In accordance with this, when producing the imaging device 1, the first insulating film 11 can be polished using the second insulating film 12 as a stopper layer. As a result, it is possible to flatten the second layer L2 in which the first insulating film 11 and the second insulating film 12 are intermixed while preventing a depression called a void or dishing from occurring in the first insulating film 11. As a result, it is possible to easily bring the surface of the second layer L2 into close contact with the support substrate 13 and reduce the occurrence of poor bonding between the second layer L2 and the support substrate 13.

Further, the second insulating film 12 shrinks due to cooling after deposition. This shrinkage generates the inward stress F3 in the second insulating film 12. Further, a reaction force to the stress F3 is generated in the first insulating film 11 that is in contact with the second insulating film 12. This reaction force to the stress F3 relaxes the stress F2 generated in the logic chip 3. As a result, for example, it is possible to prevent transistor characteristics (e.g., mobility) from changing due to a load applied to a transistor mounted on the logic chip 3 and positional deviation between the logic chip 3 and the color filter CF from occurring. It is possible to reduce the occurrence of defects due to the changes in characteristics and positional deviation.

Second Embodiment

In the first embodiment described above, the imaging device 1 has been described as an example of a sensor device according to the present disclosure. The imaging device 1 has been described to have a structure in which one logic chip 3 is bonded to the CIS substrate 2 (i.e., single-chip structure). However, the embodiments of the present disclosure are not limited thereto. The imaging device according to an embodiment of the present disclosure may have a structure in which a plurality of semiconductor chips is bonded to the CIS substrate 2 (i.e., multi-chip structure).

Figure 11:
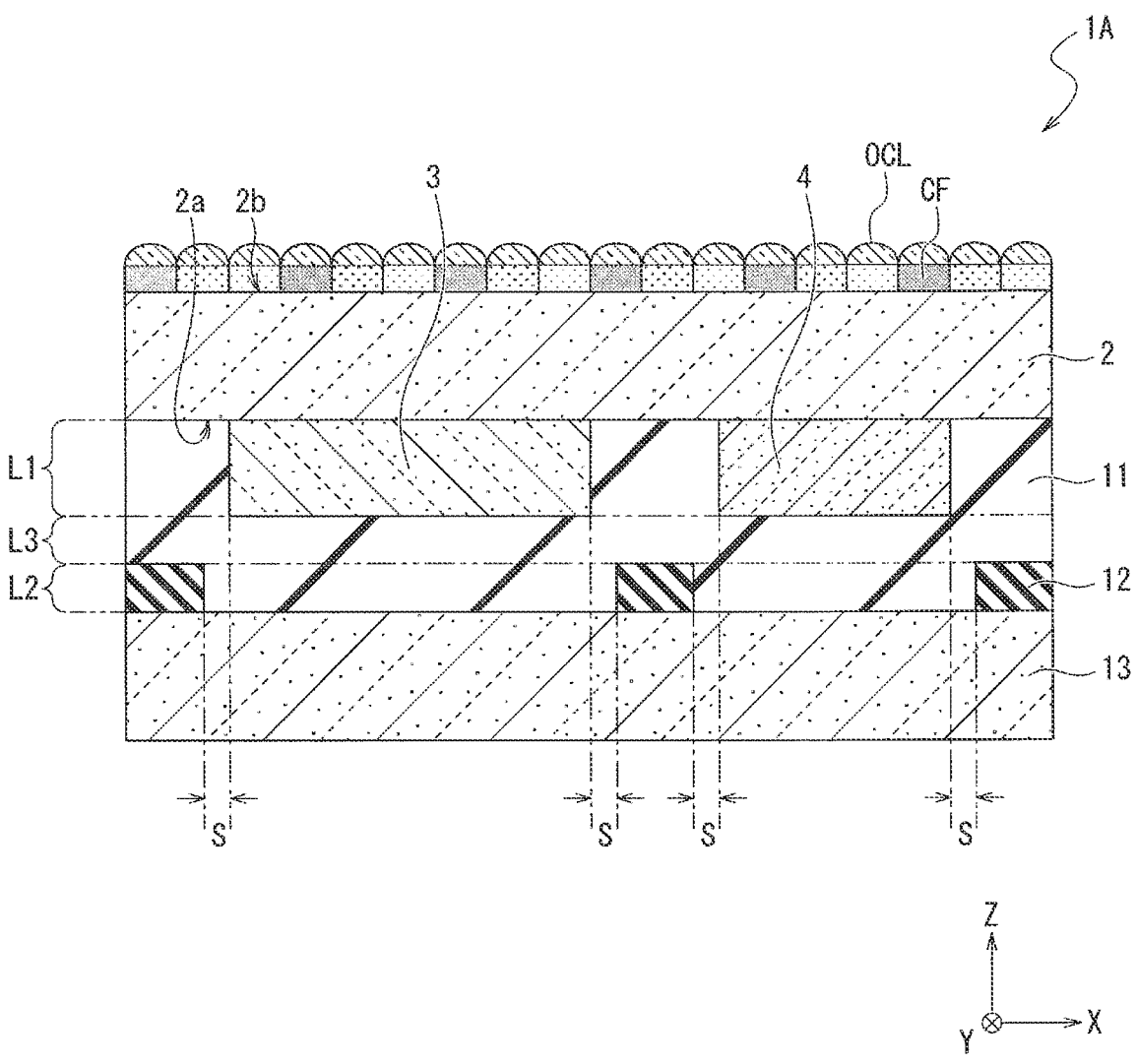
FIG. 11 is a cross-sectional view showing a configuration example of an imaging device according to a second embodiment of the present disclosure.

FIG. 11 is a cross-sectional view showing a configuration example of an imaging device 1A according to a second embodiment of the present disclosure.

As shown in FIG. 11, the imaging device 1A according to the first embodiment includes the logic chip 3 provided on the side of the one surface 2a (lower surface in FIG. 11) of the CIS substrate 2, and a memory chip 4 (an example of a "third substrate" according to the present disclosure) that is provided on the side of the one surface 2a of the CIS substrate 2 and disposed spaced apart from the logic chip 3 by a certain distance. The first insulating film 11 is provided on the side of the one surface 2a of the CIS substrate 2 and covers each of the logic chip 3 and the memory chip 4.

Figure 12:
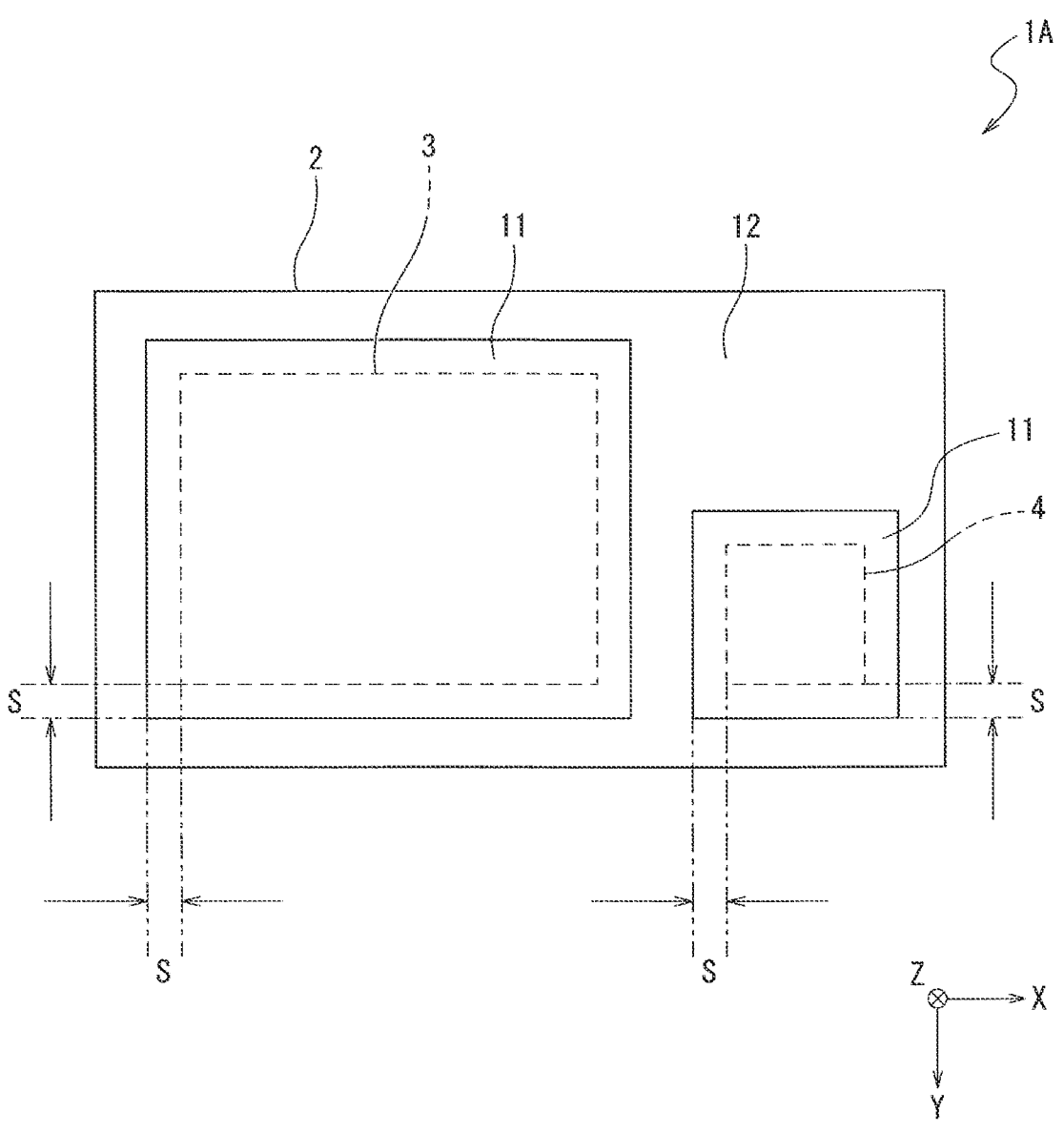
FIG. 12 is a plan view of a first insulating film and a second insulating film of the imaging device according to the second embodiment of the present disclosure as viewed from the side of a support substrate.

FIG. 12 is a plan view of the first insulating film 11 and the second insulating film 12 as viewed from the side of the support substrate 13 in the imaging device 1A according to the second embodiment of the present disclosure. As shown in FIG. 12, the first insulating film 11 is disposed so as to cover the entire region of the logic chip 3 in plan view from the Z-axis direction. Further, the second insulating film 12 is present outside the logic chip 3 (i.e., region not overlapping with the logic chip 3) and outside the memory chip 4 (i.e., region not overlapping with the memory chip 4) in plan view. The second insulating film 12 is not present in a region overlapping with the logic chip 3 and in a region overlapping with the memory chip 4 in plan view.

The second insulating film 12 and the logic chip 3 are spaced apart from each other by the distance S in plan view. Similarly, also the second insulating film 12 and the memory chip 4 are spaced apart from each other by the distance S. The second insulating film 12 is disposed so as to cover each of the logic chip 3 and the memory chip 4.

Figure 13:
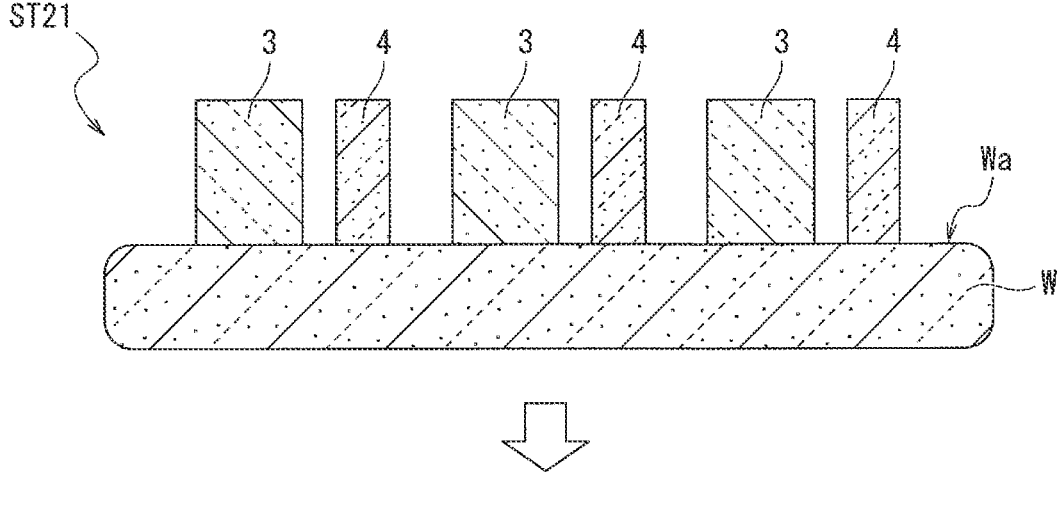
FIG. 13 is a cross-sectional view showing a method of producing the imaging device according to the second embodiment of the present disclosure in order of steps.
Figure 13:
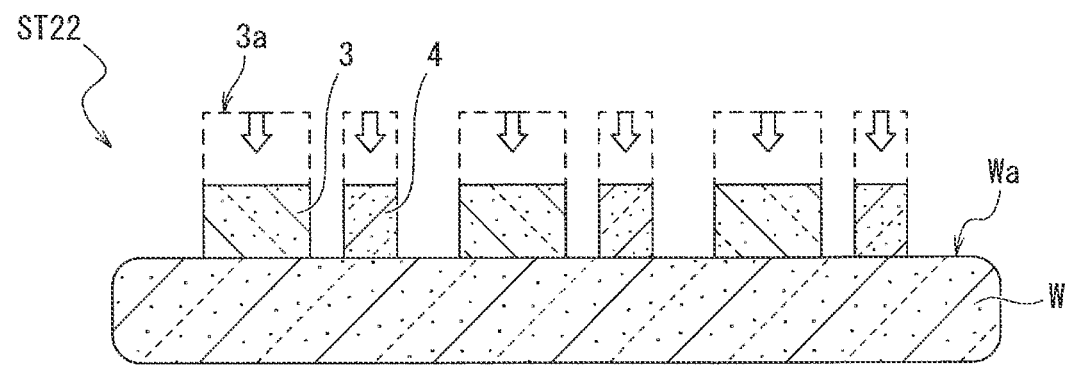
Figure 13:
Figure 13:
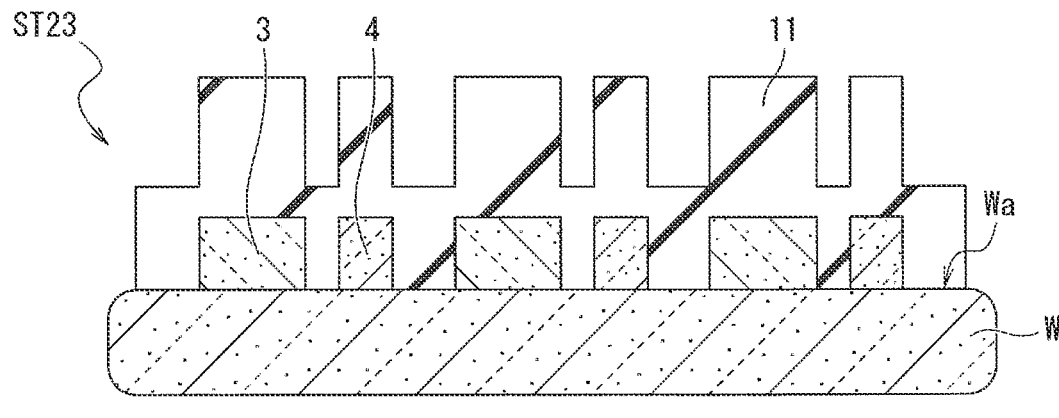
Figure 13:
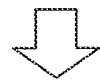
Figure 14:
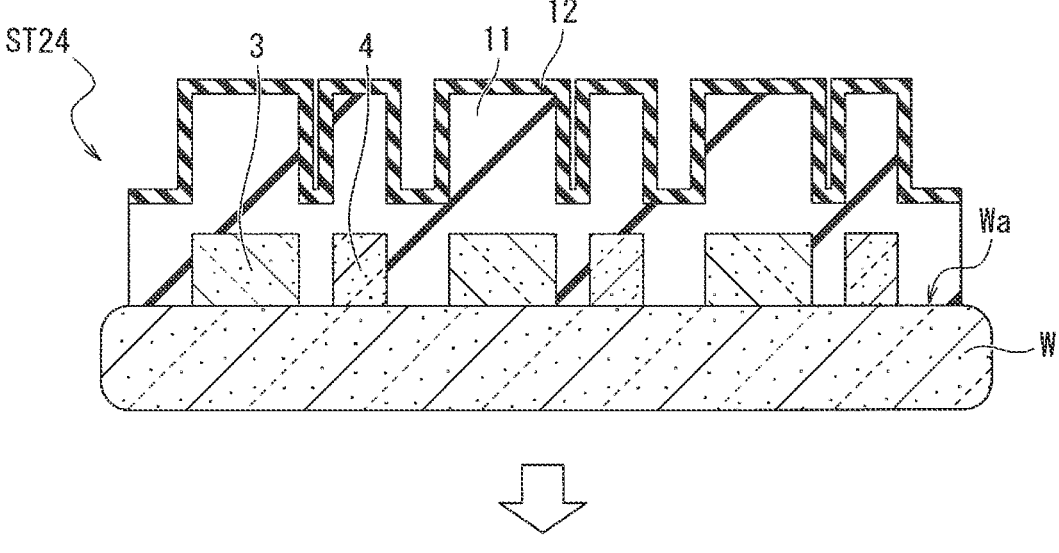
FIG. 14 is a cross-sectional view showing the method of producing the imaging device according to the second embodiment of the present disclosure in order of steps.
Figure 14:
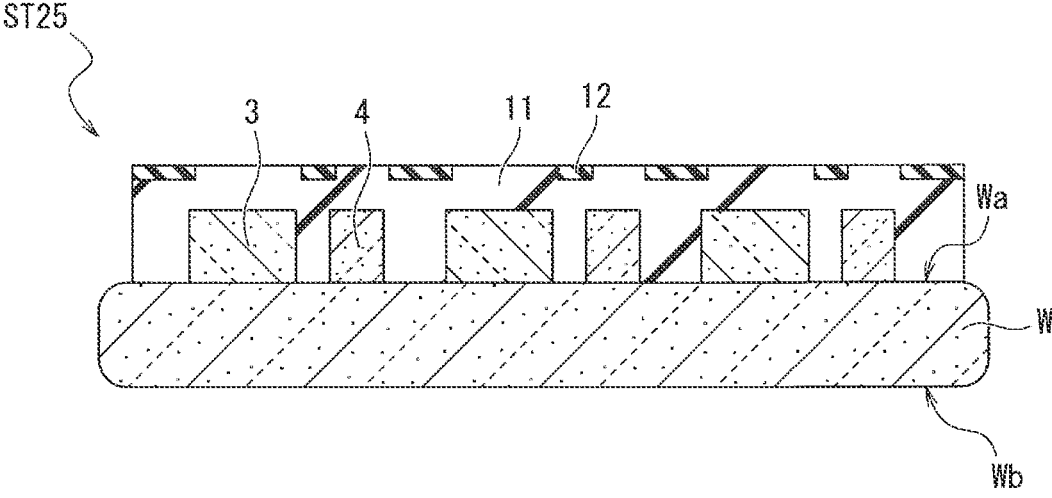

Next, an example of a method of producing the imaging device 1A according to the second embodiment of the present disclosure will be described. FIG. 13 and FIG. 14 are each a cross-sectional view showing a method of producing the imaging device 1A according to the second embodiment of the present disclosure in order of steps. As shown in Step ST21 in FIG. 13, the production device bonds the logic chip 3 and the memory chip 4 to the CIS substrate 2 in which a CMOS image sensor is formed. This bonding is performed by a CoW (Chip on Wafer). In the bonding by a CoW, the logic chip 3 determined to be a non-defective product and the memory chip 4 determined to be a non-defective product are bonded to the CMOS image sensor 2' determined to be a non-defective product (see FIG. 15).

Next, as shown in Step ST22 in FIG. 13, the production device grinds the surface 3a of the logic chip 3 and a surface 4a of the memory chip 4 to thin the logic chip 3 and the memory chip 4. Next, as shown in Step ST23 in FIG. 13, the production device deposits the first insulating film 11 on the wafer W on the side of the one surface Wa by a CVD method to cover the plurality of logic chips 3 and a plurality of memory chips 4 and fill the spaces between the logic chips 3 adjacent to each other, the spaces between the memory chips 4 adjacent to each other, and the spaces between the logic chip 3 and the memory chip 4 adjacent to each other.

Next, as shown in Step ST24 in FIG. 14, the production device deposits the second insulating film 12 on the first insulating film 11 by a CVD method. Since the first insulating film 11 and the second insulating film 12 are deposited reflecting the shape of the underlying layer, the first insulating film 11 and the second insulating film 12 are formed in a recessed and projecting shape reflecting the shape of the logic chip 3 and the memory chip 4. The first insulating film 11 and the second insulating film 12 are each formed in a projecting shape in a region in which the logic chip 3 is disposed and a region in which the memory chip 4 is disposed in the wafer W, and the first insulating film 11 and the second insulating film 12 are each formed in a recessed shape in a region in which the logic chip 3 is not disposed and a region in which the memory chip 4 is not disposed.

Next, as shown in Step ST25 in FIG. 14, the production device performs CMP processing on the second insulating film 12 and the first insulating film 11 from the side of the second insulating film 12 to flatten the side of the one surface Wa of the wafer W. Similarly to the method of producing the imaging device 1 described in the first embodiment, the second insulating film 12 functions as a stopper film of the CMP processing on the first insulating film 11 also in the method of producing the imaging device 1A according to the second embodiment.

Figure 15:
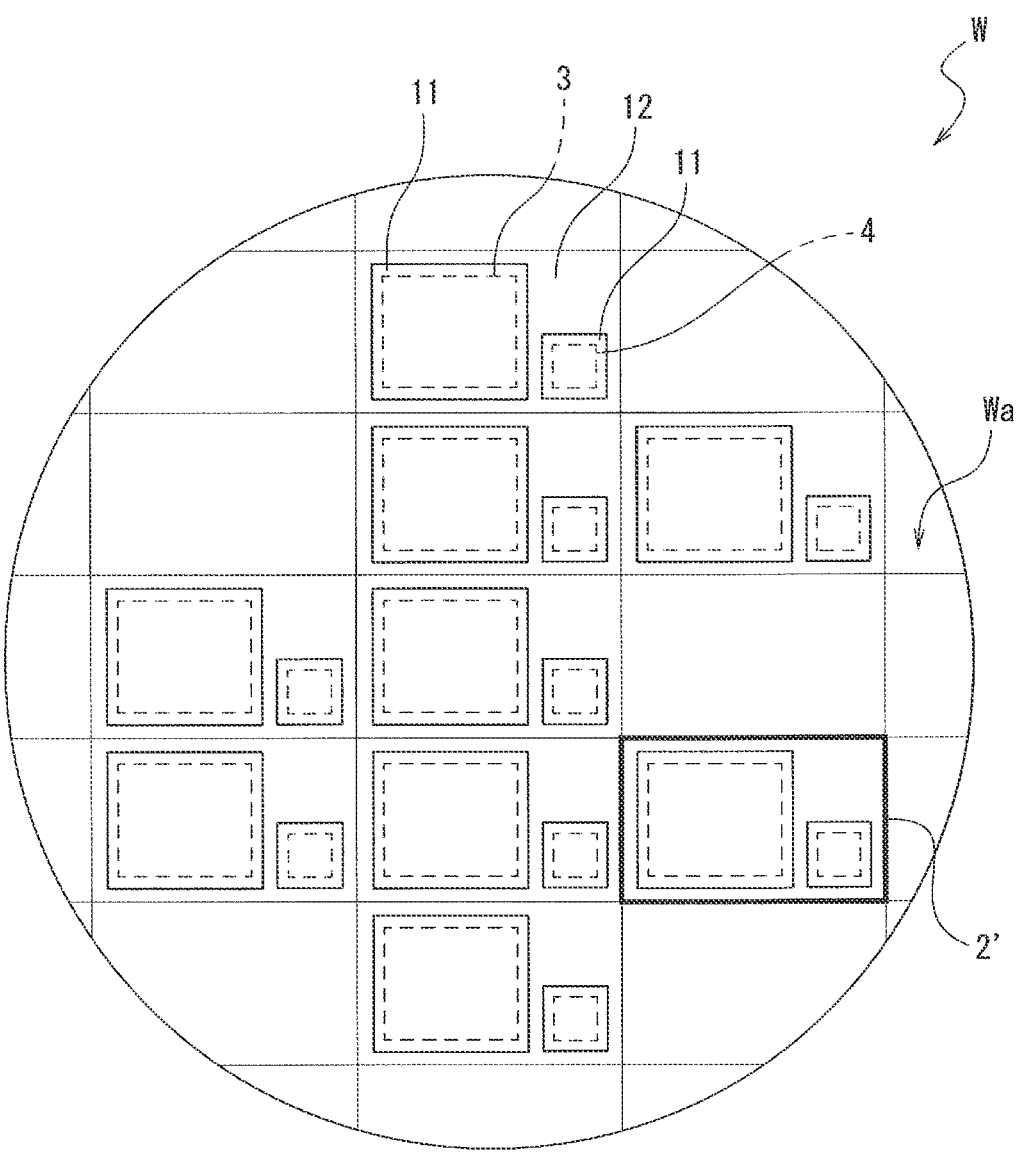
FIG. 15 is a plan view schematically showing the side of one surface of a wafer after Step ST25 (CMP processing) shown in FIG. 14 is performed.

FIG. 15 is a plan view schematically showing the side of the one surface Wa of the wafer W after Step ST25 (CMP processing) in FIG. 14 is performed. By the CMP processing, the second insulating film 12 is formed in a shape surrounding each of the logic chip 3 and the memory chip 4 in plan view. Further, as shown in FIG. 12, the second insulating film 12 and the logic chip 3 are spaced apart from each other by the distance S in plan view, and the second insulating film 12 and the memory chip 4 are spaced apart from each other by the distance S in plan view.

The steps subsequent thereto are similar to those in the first embodiment. The production device grinds the other surface Wb of the wafer W to thin the wafer W. Next, the production device forms the color filter CF (see FIG. 11) on the side of the other surface Wb of the wafer W and attaches the on-chip lens OCL (see FIG. 11) onto the color filter CF. After that, the production device dices the wafer W and the support substrate 13 along a dicing line to divide them into pieces. The imaging device 1A shown in FIG. 11 is completed through the above steps.

The imaging device 1A according to the second embodiment of the present disclosure exhibits effects similar to those of the imaging device 1 according to the first embodiment. That is, when producing the imaging device 1A, the first insulating film 11 can be polished using the second insulating film 12 as a stopper layer. As a result, it is possible to flatten the second layer L2 in which the first insulating film 11 and the second insulating film 12 are intermixed while preventing a depression called a void or dishing from occurring in the first insulating film 11. As a result, it is possible to easily bring the surface of the second layer L2 into close contact with the support substrate 13 and reduce the occurrence of poor bonding between the second layer L2 and the support substrate 13.

Further, the second insulating film 12 shrinks due to cooling after deposition. This shrinkage generates the inward stress F3 (see FIG. 10) in the second insulating film 12. Further, a reaction force to the stress F3 is generated in the first insulating film 11 that is in contact with the second insulating film 12. This reaction force to the stress F3 relaxes the stress F2 generated in the logic chip 3 and the stress F2 generated in the memory chip 4. As a result, for example, it is possible to prevent transistor characteristics (e.g., mobility) from changing due to a load applied to a transistor mounted on the logic chip 3 and a transistor mounted on the memory chip 4. Further, it is possible to prevent positional deviation between the logic chip 3 and the color filter CF and the memory chip 4 and the color filter CF from occurring. As a result, it is possible to reduce the occurrence of defects due to the changes in characteristics and positional deviation.

Modified Example

Note that in the imaging device 1A, the number of the logic chips 3 bonded to the CIS substrate 2 and the number of the memory chips 4 bonded to the CIS substrate 2 are each not limited to one. The number of the logic chips 3 bonded to the CIS substrate 2 may be two or more, and the number of the memory chips 4 bonded to the CIS substrate 2 may be two or more. Further, a different semiconductor chip other than the logic chip 3 and the memory chip 4 may be bonded to the CIS substrate 2.

Figure 16:
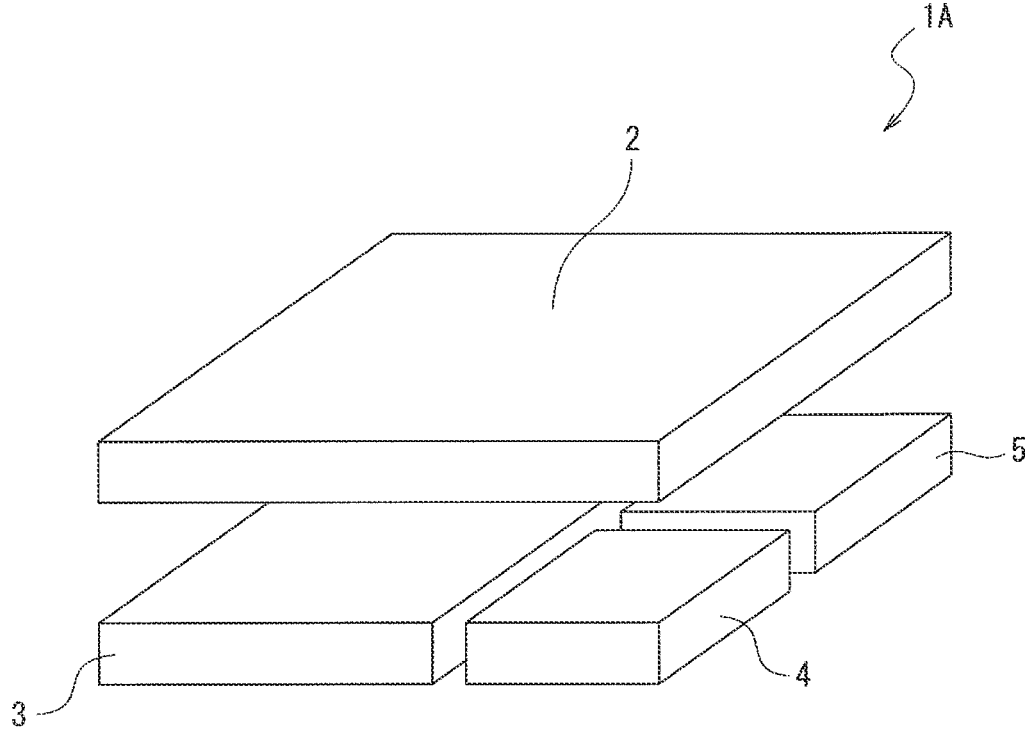
FIG. 16 is a diagram showing a modified example of the imaging device according to the second embodiment of the present disclosure.

FIG. 16 is a diagram showing a modified example of the imaging device 1A according to the second embodiment of the present disclosure. As shown in FIG. 16, in the imaging device 1A, the logic chip 3, the memory chip 4, and an AI (artificial intelligence) chip 5 may be bonded to the CIS substrate 2. The AI chip 5 is an example of the "different semiconductor chip" described above. Even with such a configuration, the imaging device 1A is capable of reducing the occurrence of poor bonding between the second layer L2 and the support substrate 13, the changes in transistor characteristics, and defects due to positional deviation of the color filter CF, similarly to the above.

Third Embodiment

In the first embodiment, it has been described that the logic chip 3 is bonded to the CIS substrate 2 by a CoW.

Further, in the second embodiment, it has been described that the logic chip 3, the memory chip 4, and the AI chip 5 are bonded to the CIS substrate 2 by a CoW. However, in the embodiments of the present disclosure, a target to which a semiconductor chip is bonded by a CoW is not limited to the CIS substrate 2. A target to which a semiconductor chip is bonded by a CoW may be a logic substrate or may be a stacked substrate of a CIS substrate and a logic substrate. The stacked substrate of a CIS substrate and a logic substrate may be formed by a WoW (Wafer on Wafer).

Figure 17:
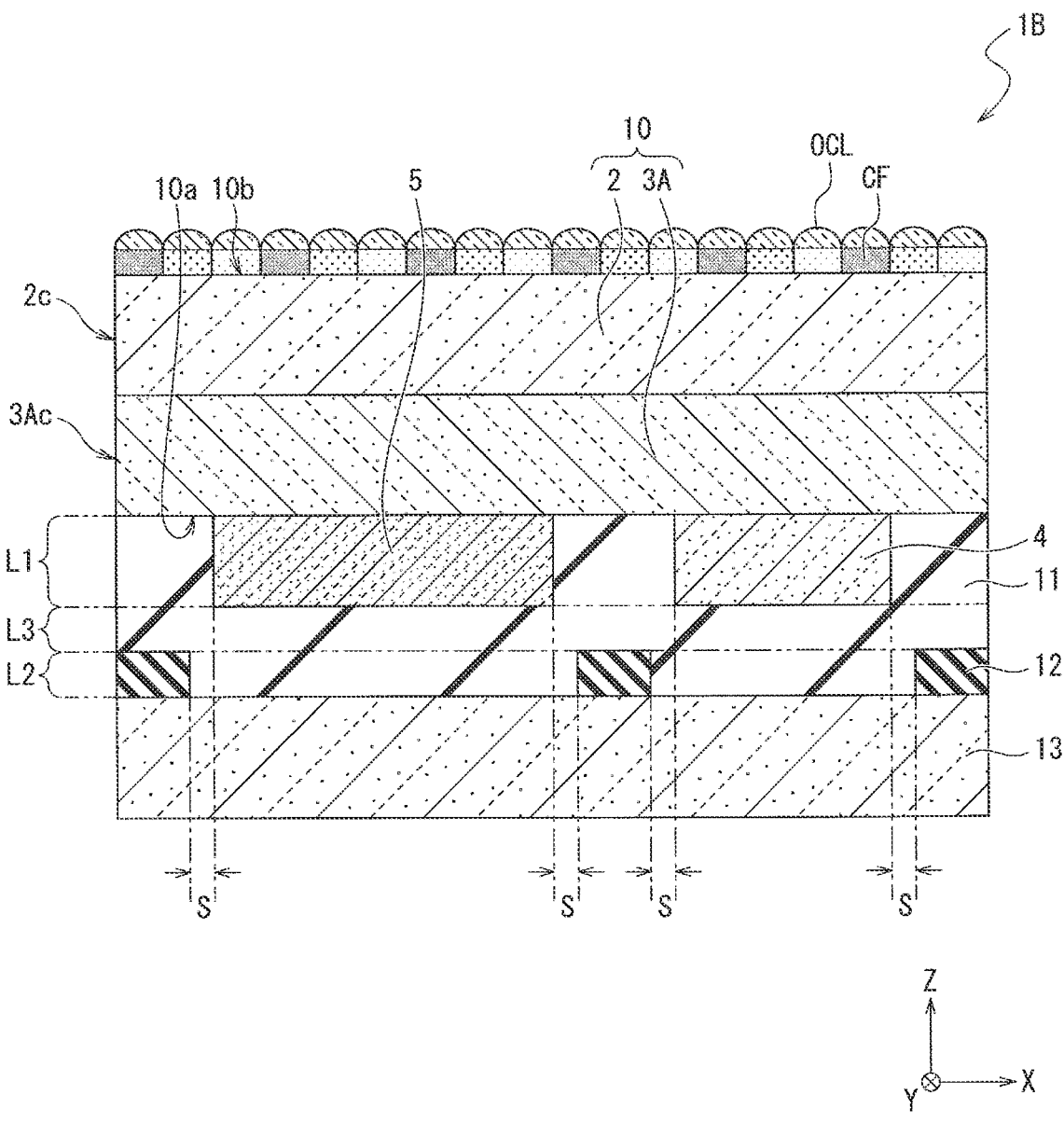
FIG. 17 is a cross-sectional view showing a configuration example of an imaging device according to a third embodiment of the present disclosure.

FIG. 17 is a cross-sectional view showing a configuration example of an imaging device 1B according to a third embodiment of the present disclosure. As shown in FIG. 17, the imaging device 1B according to the third embodiment includes a stacked substrate 10 (an example of a "first substrate" according to the present disclosure) in which a logic substrate 3A is stacked on the CIS substrate 2, the memory chip 4 provided on the side of one surface 10a (lower surface in FIG. 17) of the stacked substrate 10, the AI chip 5 that is provided on the side of the one surface 10a of the stacked substrate 10 and disposed spaced apart from the memory chip 4, the first insulating film 11 that is provided on the side of the one surface 10a of the stacked substrate 10 and covers the memory chip 4 and the AI chip, the second insulating film 12 facing the stacked substrate 10 across the first insulating film 11, the support substrate 13 that is provided at a position facing the stacked substrate 10 across the first insulating film 11 and the second insulating film 12 and is in contact with each of the first insulating film 11 and the second insulating film 12, the color filter CF provided on the side of the other surface 10b (upper surface in FIG. 17) opposite to the one surface 10a of the stacked substrate 10, and the on-chip lens OCL provided at a position facing the stacked substrate 10 across the color filter CF.

In this example, the stacked substrate 10 is an example of a "first substrate" according to the present disclosure. Each of the memory chip 4 and the AI chip 5 is an example of a "second substrate" according to the present disclosure.

Further, the imaging device 1 includes the first layer L1, the second layer L2, and the third layer L3 between the stacked substrate 10 and the support substrate 13. The first layer L1 is a layer in which the memory chip 4, the AI chip 5, and the first insulating film 11 are intermixed. The second layer L2 is a layer in which the first insulating film 11 and the second insulating film 12 are intermixed. The third layer L3 is a layer that is located between the first layer L1 and the second layer L2 and includes only the first insulating film 11.

The logic substrate 3A is a semiconductor substrate on which a logic circuit is formed. The logic substrate 3A is electrically connected to the CIS substrate 2. The logic circuit of the logic substrate 3A performs various types of signal processing regarding the operations of the imaging device 1B, e.g., performs predetermined processing on the electrical signal output from the CIS substrate 2. Note that not only the logic substrate 3A but also the CIS substrate 2 may include a circuit for performing signal processing regarding the operations of the imaging device 1.

The CIS substrate 2 and the logic substrate 3A are bonded to each other by, for example, a WoW to form the stacked substrate 10. In the WoW, stacked wafers are obtained by bonding wafers to each other and then the stacked wafer is cut along a dicing line to divide it into pieces. For this reason, a side surface 2c on the outer periphery of the CIS substrate 2 and a side surface 3Ac of the outer periphery of the logic substrate 3A, which are bonded by the WoW, are disposed to be flush with each other.

The imaging device 1B is capable of reducing the occurrence of poor bonding between the second layer L2 and the support substrate 13, the changes in transistor characteristics, and defects due to positional deviation of the color filter CF, similarly to the imaging devices 1 and 1A.

Other Embodiments

As described above, although the present disclosure has been described through embodiments and modified examples, the statements and drawings forming part of this disclosure should not be understood to limit the present disclosure. Various alternative embodiments, Examples, and operational technologies will become apparent to those skilled in the art from this disclosure. It goes without saying that the present technology includes various embodiments and the like that are not described here. At least one of various omissions, replacements, and modifications of components can be made without departing from the essence of the above-mentioned embodiments and modified examples. Further, the effects described herein are merely illustrative and not restrictive, and other effects may be exhibited.

(Application Example to Electronic Apparatus)

The above-mentioned imaging devices 1, 1A, and 1B can be applied to various electronic apparatuses, e.g., an imaging device such as a digital still camera and a digital video camera, a mobile phone having an imaging function, or another device having an imaging function.

Figure 18:
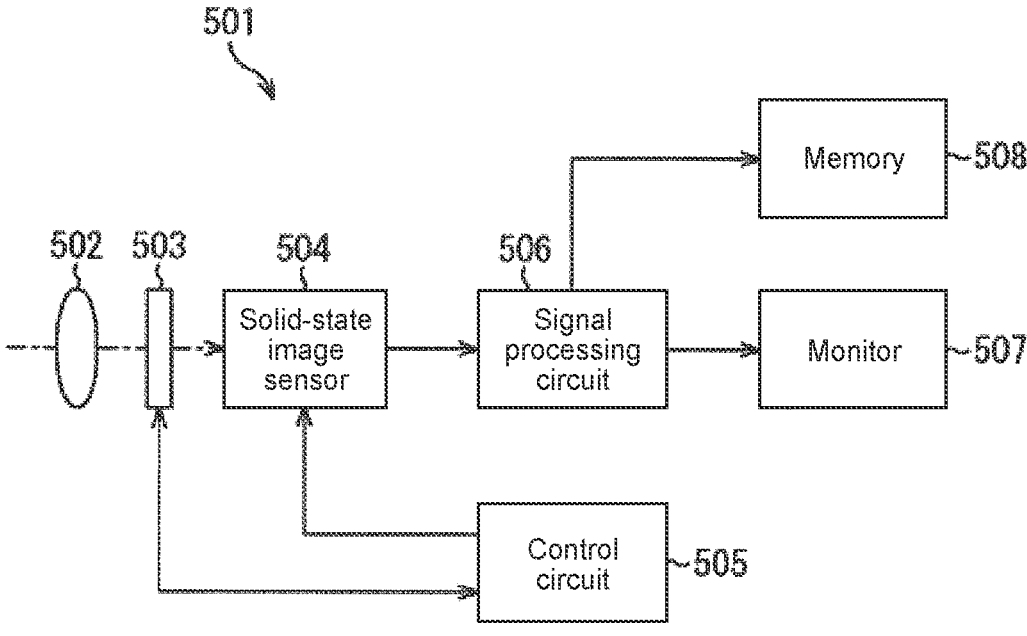
FIG. 18 is a block diagram showing a configuration example of an imaging device as an electronic apparatus to which the present technology is applied.

FIG. 18 is a block diagram showing a configuration example of an imaging device as an electronic apparatus to which the present technology is applied. An imaging device 501 shown in FIG. 18 includes an optical system 502 (an example of an "optical part" according to the present disclosure), a shutter device 503, a solid-state image sensor 504, a drive circuit 505, a signal processing circuit 506, a monitor 507, and a memory 508 and is capable of capturing a still image and a moving image.

The optical system 502 includes one or more lenses, causes light from a subject (incident light) to be transmitted therethrough, causes the light to enter the solid-state image sensor 504, and forms an image of the light on the light-receiving surface of the solid-state image sensor 504. The shutter device 503 is disposed between the optical system 502 and the solid-state image sensor 504, and controls a light irradiation period and a light shielding period for the solid-state image sensor 504 in accordance with the control of the drive circuit 505.

The solid-state image sensor 504 includes a package including the above-mentioned imaging device 1, 1A, or 1B. The solid-state image sensor 504 accumulates signal charges for a certain period of time in accordance with light whose image is formed on the light-receiving surface via the optical system 502 and the shutter device 503. The signal charges accumulated in the solid-state image sensor 504 are transferred in accordance with the drive signal (timing signal) supplied from the drive circuit 505.

The drive circuit 505 outputs drive signals for controlling the transfer operation of the solid-state image sensor 504 and the shutter operation of the shutter device 503 to drive the solid-state image sensor 504 and the shutter device 503.

The signal processing circuit 506 performs various types of signal processing on the signal charges output from the solid-state image sensor 504. The image (image data) obtained by performing signal processing by the signal processing circuit 506 is supplied to the monitor 507 and displayed or is supplied to the memory 508 and stored (recorded).

Also in the imaging device 501 configured in this way, it is possible to reduce the occurrence of defects by applying the above-mentioned imaging device 1, 1A, or 1B to the solid-state image sensor 504.

<Usage Example of Image Sensor>

Figure 19:
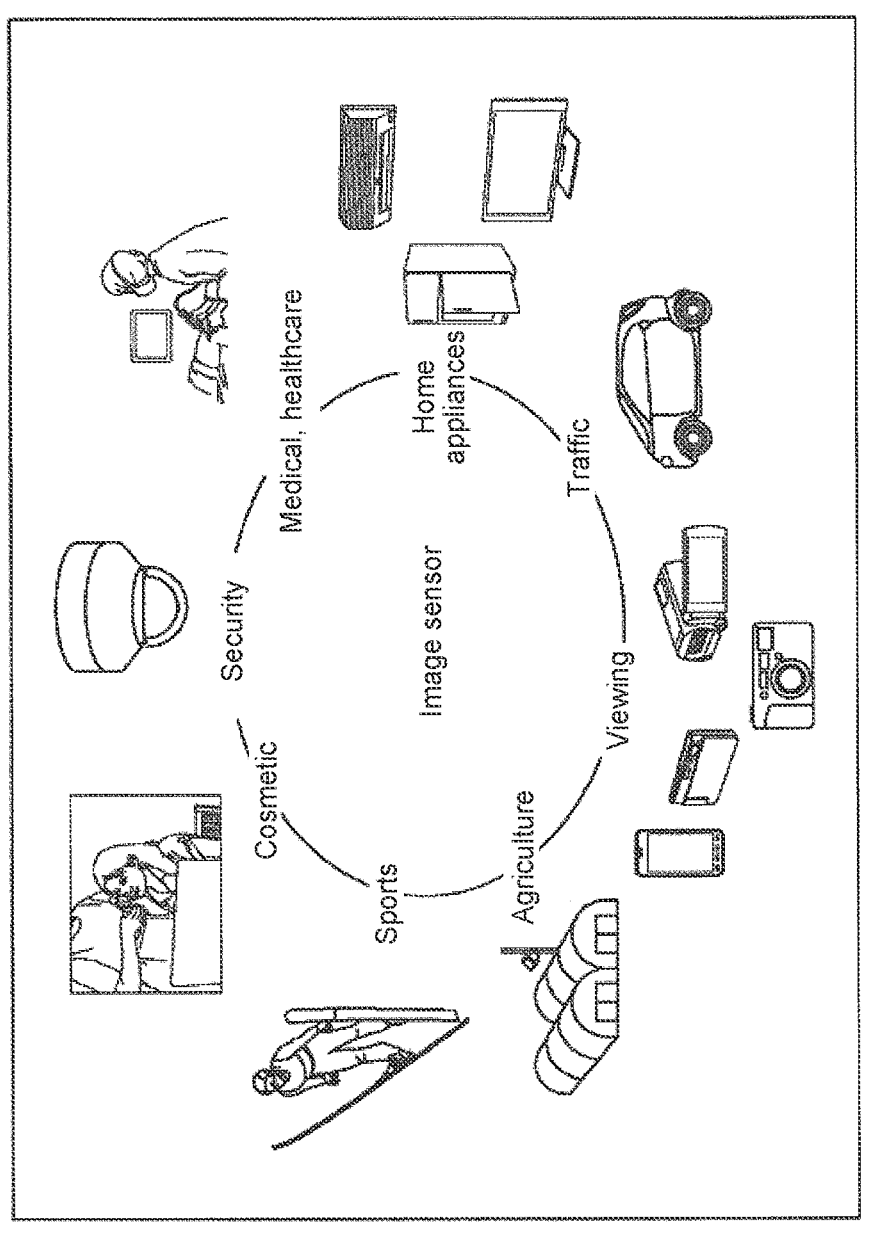
FIG. 19 is a diagram showing a usage example of using the above-mentioned imaging device.

FIG. 19 is a diagram showing a usage example of using the above-mentioned imaging devices 1, 1A, and 1B.

The above-mentioned imaging devices 1, 1A, and 1B can be used in various cases of sensing light such as visible light, infrared light, ultraviolet light, and X-rays, for example, as described below.

Apparatus for capturing images used for viewing, such as a digital camera and a portable device with a camera function Apparatus used for traffic purposes, such as an in-vehicle sensor for imaging the front, rear, surrounding, and interior of automobiles for safe driving such as automatic stopping or for recognizing the state of drivers, etc., a monitoring camera for monitoring traveling vehicles and roads, and range-finding sensor for range-finding between vehicles, etc.

Apparatus used in home appliances such as a TV, a refrigerator, and an air conditioner to image the gestures of users and perform device operations in accordance with the gestures Apparatus used for medical and healthcare purposes, such as an endoscope and an apparatus that performs angiography by receiving infrared light Apparatus used for security purposes, such as a monitoring camera for security purposes and a camera for personal identification purposes Apparatus used for cosmetic purposes, such as a skin measuring apparatus for imaging skin and a microscope for imaging scalp Apparatus used for sports purposes, such as an action camera for sports purposes and a wearable camera Apparatus used for agricultural purposes, such as a camera for monitoring the states of fields and crops (Application Example to Endoscopic Surgery System)

The technology according to the present disclosure (the present technology) can be applied to various products. For example, the technology according to the present disclosure may be applied to an endoscopic surgery system.

Figure 20:
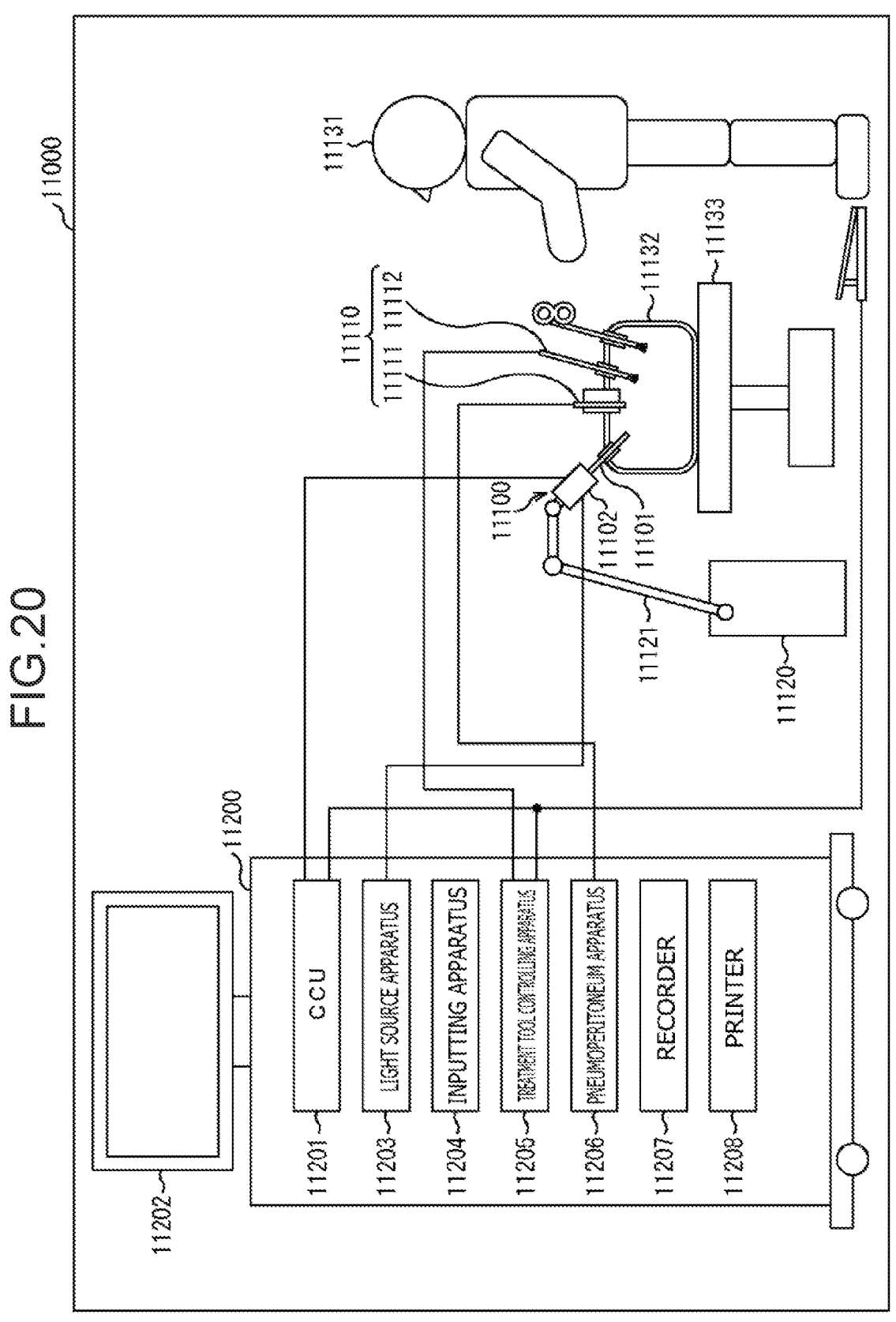
FIG. 20 is a view depicting an example of a schematic configuration of an endoscopic surgery system.

FIG. 20 is a view depicting an example of a schematic configuration of an endoscopic surgery system to which the technology according to an embodiment of the present disclosure (present technology) can be applied.

In FIG. 20, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 21:
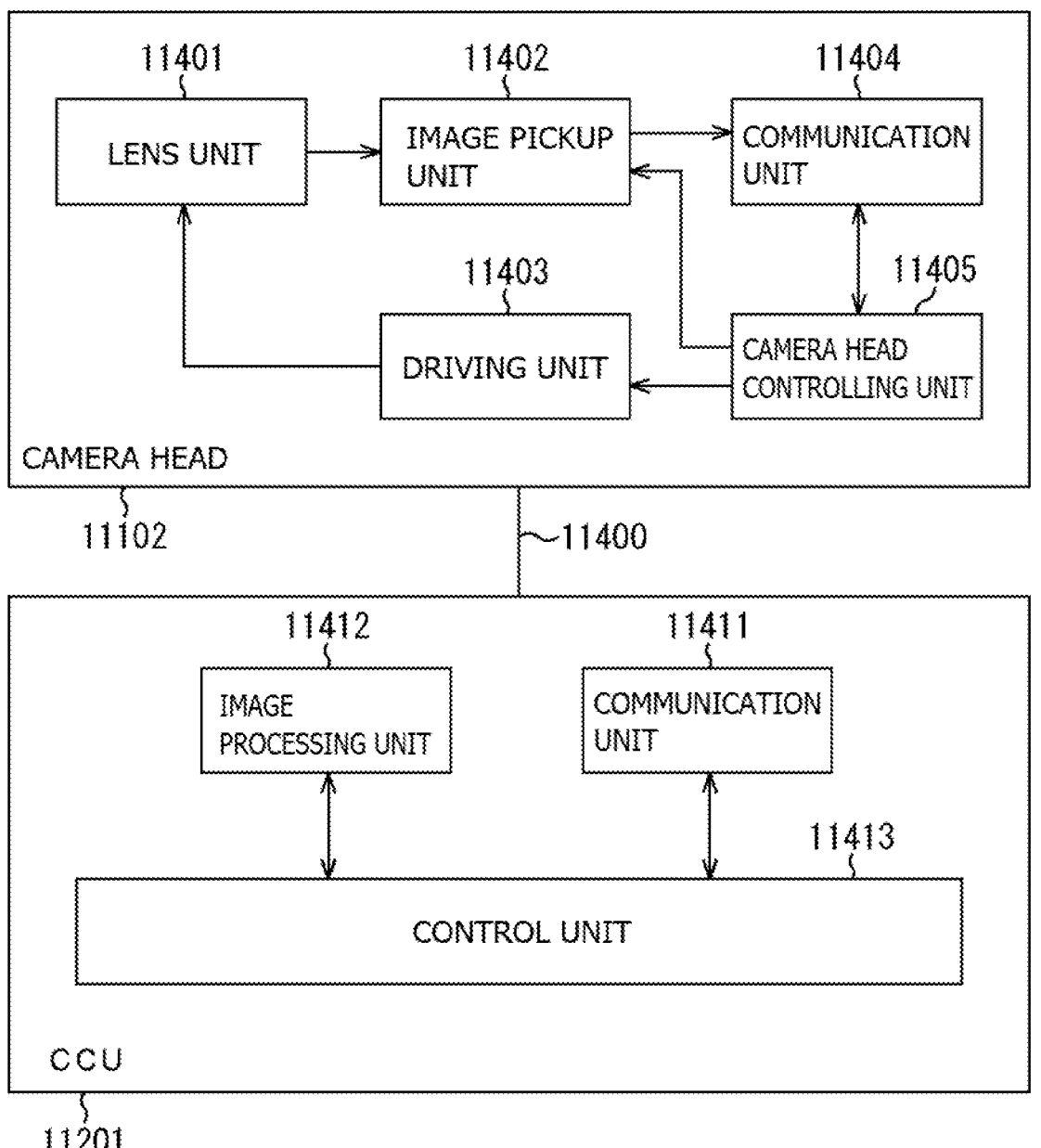
FIG. 21 is a block diagram depicting an example of a functional configuration of a camera head and a camera control unit (CCU).

FIG. 21 is a block diagram depicting an example of a functional configuration of the camera head 11102 and the CCU 11201 depicted in FIG. 20.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of an endoscopic surgery system to which the technology according to the present disclosure can be applied has been described above. The technology according to the present disclosure is applicable to, for example, the endoscope 11100, (the image pickup unit 11402) of the camera head 11102, or (the image processing unit 11412) of the CCU 11201, of the configurations described above. Specifically, the imaging device 1 shown in FIG. 1, the imaging device 1A shown in FIG. 11, the modified example of the imaging device 1A shown in FIG. 16, and the imaging device 1B shown in FIG. 17 can be applied to the image pickup unit 11402. By applying the technology according to the present disclosure to the endoscope 11100, the image pickup unit 11402 of the camera head 11102, the image processing unit 11412 of the CCU 11201, or the like, it is possible to reduce the occurrence of defects in the imaging device, for example, and a surgeon can reliably check a surgical region because a clearer image of a surgical region can be acquired.

Note that the endoscopic surgery system has been described here as an example, but the technology according to the present disclosure may be applied to, for example, a microscopic surgery system or the like.

<Application Example to Moving Object>

The technology according to the present disclosure (the present technology) is applicable to various products. For example, the technology according to the present disclosure may be realized as an apparatus mounted on any type of moving objects such as an automobile, an electric vehicle, a hybrid electric vehicle, a motorcycle, a bicycle, personal mobility, an airplane, a drone, a ship, and a robot.

Figure 22:
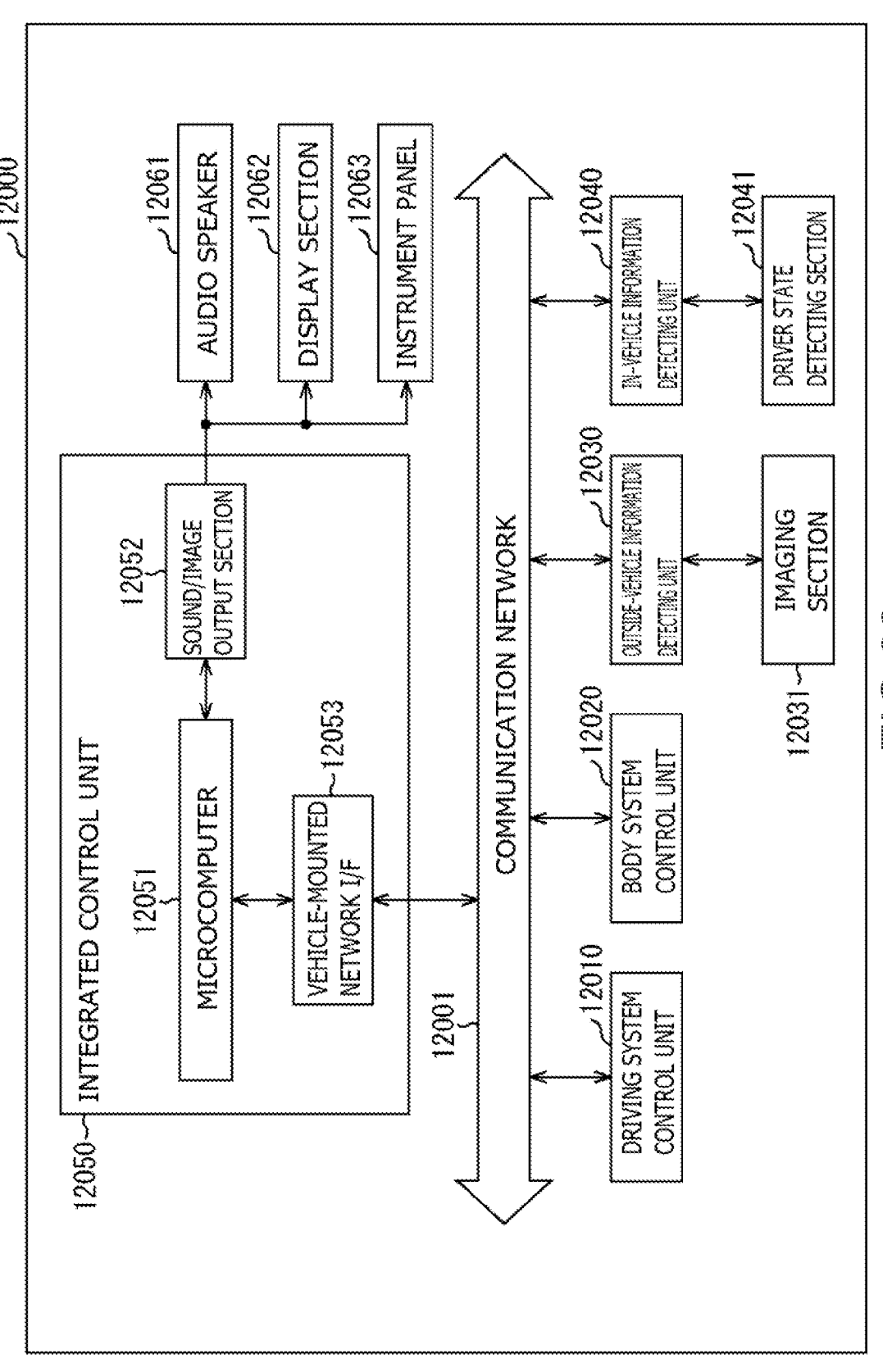
FIG. 22 is a block diagram depicting an example of schematic configuration of a vehicle control system.

FIG. 22 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

Figure 23:
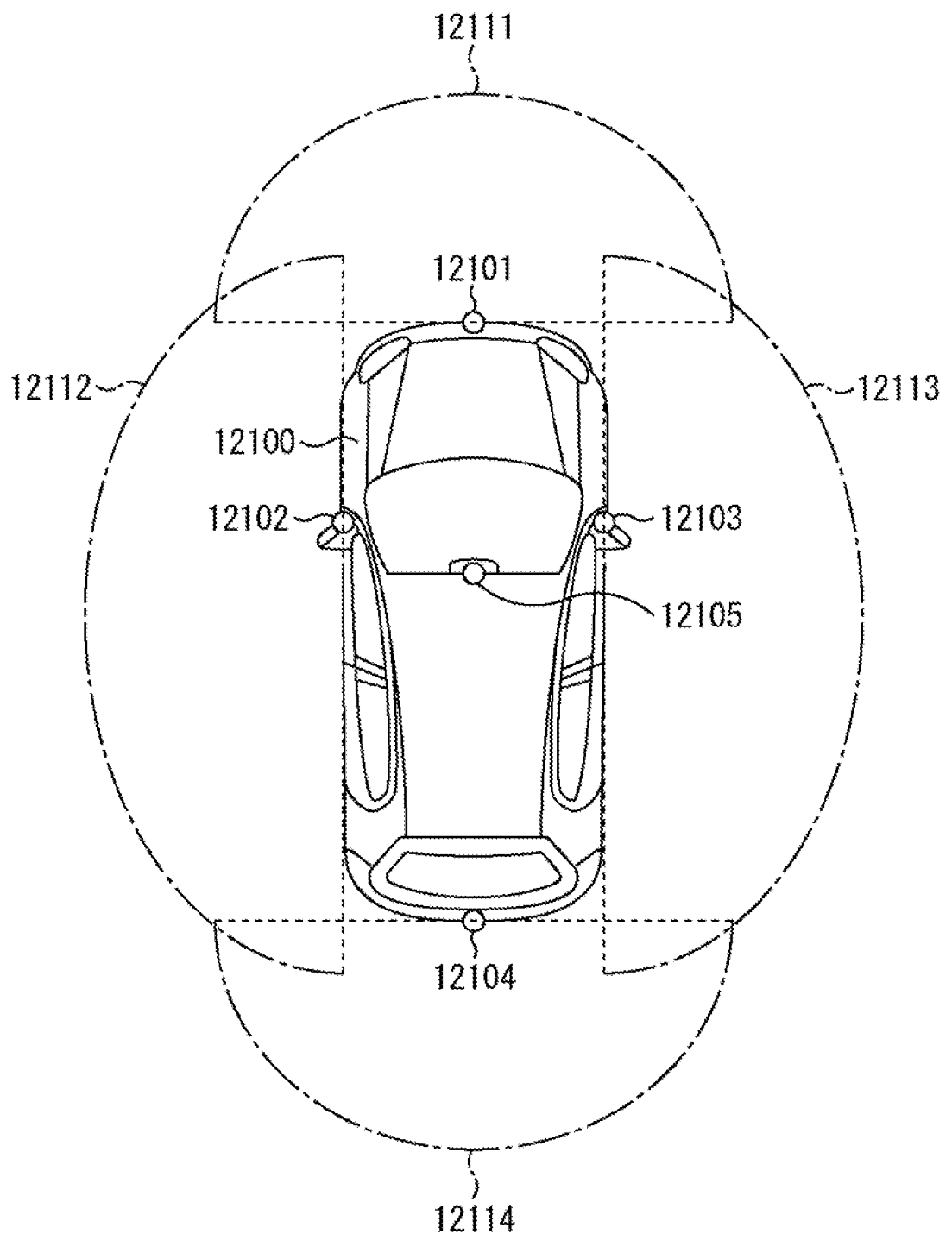
FIG. 23 is a diagram of assistance in explaining an example of installation positions of an outside-vehicle information detecting section and an imaging section.

FIG. 23 is a diagram depicting an example of the installation position of the imaging section 12031.

In FIG. 23, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure can be applied has been described above. The technology according to the present disclosure can be applied to the imaging section 12031 or the like, of the configurations described above. Specifically, the imaging device 1 shown in FIG. 1, the imaging device 1A shown in FIG. 11, the modified example of the imaging device 1A shown in FIG. 16, and the imaging device 1B shown in FIG. 17 can be applied to the imaging section 12031. By applying the technology according to the present disclosure to the imaging section 12031, it is possible to reduce the occurrence of defects in the imaging device, for example, and reduce the fatigue of drivers because an image that is easier to see can be acquired.

It should be noted that the present disclosure may take the following configurations.

(1) A sensor device, including:

a first substrate;

a second substrate provided on a side of one surface of the first substrate;

an insulating first film that is provided on the side of the one surface and covers the second substrate; and a second film that is formed of a material different from that of the first film and provided at a position facing the first substrate across the first film, the second substrate and the first film being intermixed in a first layer, the first film and the second film being intermixed in a second layer, the second film being present outside the second substrate in plan view from a direction normal to the one surface.

(2) The sensor device according to (1) above, further including a third layer that is located between the first layer and the second layer and includes only the first film.

(3) The sensor device according to (1) or (2) above, further including a support substrate that is provided at a position facing the first substrate across the first layer and the second layer and is in contact with the second layer.

(4) The sensor device according to any one of (1) to (3), further including a third substrate that is disposed on the side of the one surface and is included in the first layer, the first film covering the third substrate, the second film being present outside the third substrate in the plan view.

(5) The sensor device according to any one of (1) to (4), in which the first substrate is a stacked substrate in which a plurality of substrates is stacked in a thickness direction.

(6) The sensor device according to any one of (1) to (5), further including a color filter provided on a side of the other surface that is an opposite side of the one surface of the first substrate.

(7) The sensor device according to any one of (1) to (6), in which the first layer has a thickness of 10 μm or more and 200 μm or less.

(8) The sensor device according to any one of (1) to (7), in which the second layer has a thickness of 10 μm or less.

(9) An electronic apparatus, including:

an optical part; and a sensor device, light that has been transmitted through the optical part entering the sensor device, the sensor device including a first substrate, a second substrate provided on a side of one surface of the first substrate, an insulating first film that is provided on the side of the one surface and covers at least a side surface of the second substrate, and a second film that is formed of a material different from that of the first film and provided at a position facing the first substrate across the first film, the second substrate and the first film being intermixed in a first layer, the first film and the second film being intermixed in a second layer, the second film being present outside the second substrate in plan view from a direction normal to the one surface.

REFERENCE SIGNS LIST 1, 1A, 1B imaging device
2 CIS substrate
2' CMOS image sensor
2a, 10a, Wa one surface
2b, 10b, Wb other surface
2c, 3Ac side surface
3 logic chip
3' logic circuit
3a, 4a, 11a, 12a, 21a, 221a, 321a surface
3A logic substrate
4 memory chip
5 AI chip
10 stacked substrate
11 first insulating film
12 second insulating film
13 support substrate
21, 31 substrate portion
22, 32 wiring portion
111 projecting portion
112 recessed portion
121 first plane portion
122 side wall portion
123 second plane portion
204 solid-state image sensor
221, 321 insulating film
222, 322 wiring layer
223, 323 electrode layer
501 imaging device
502 optical system 503 shutter device
504 solid-state image sensor
505 drive circuit
506 signal processing circuit
507 monitor
508 memory
10402 imaging unit
11000 endoscopic surgery system
11100 endoscope
11101 lens barrel
11102 camera head
11110 surgical tool
11111 pneumoperitoneum tube
11112 energy treatment tool
11120 supporting arm apparatus
11131 surgeon (medical doctor)
11132 patient
11133 patient bed
11200 cart
11201 camera control unit (CCU)
11202 display apparatus
11203 light source apparatus
11204 inputting apparatus
11205 treatment tool controlling apparatus
11206 pneumoperitoneum apparatus
11207 recorder
11208 printer
11400 transmission cable
11401 lens unit
11402 image pickup unit
11403 driving unit
11404 communication unit
11405 camera head controlling unit
11411 communication unit
11412 image processing unit
11413 control unit
12000 vehicle control system
12001 communication network
12010 driving system control unit
12020 body system control unit
12030 outside-vehicle information detecting unit
12031 imaging section
12040 in-vehicle information detecting unit
12041 driver state detecting section
12050 integrated control unit
12051 microcomputer
12052 sound/image output section
12061 audio speaker
12062 display section
12063 instrument panel
12100 vehicle
12101, 12102, 12103, 12104, 12105 imaging section
12111, 12112, 12113, 12114 imaging range
DL dicing line
F1, F2, F3 stress
I vehicle-mounted network interface
ICG indocyanine green
L1 first layer
L2 second layer
L3 third layer
OCL on-chip lens
R23 bonding region
W wafer

What is claimed is:

1. A sensor device, comprising:

a first substrate comprising an image sensor;

a second substrate comprising a logic circuit for processing signals from the image sensor, the second substrate being provided on a first surface side of the first substrate;

a first insulating film that is provided on the first surface side of the first substrate and that covers the second substrate; and a second insulating film that is formed of a material different from that of the first insulating film and that is disposed in the first insulating film on a side of the first insulating film opposite the second substrate, wherein the second insulating film does not overlap the second substrate in a plan view.

2. The sensor device according to claim 1, further comprising wherein a surface of the second substrate and a surface of the second insulating film that are closest to one another are separated by part of the first insulating film.

3. The sensor device according to claim 1, further comprising:

a support substrate in contact with the first insulating film and the second insulating film.

4. The sensor device according to claim 1, further comprising:

a third substrate that is disposed on the side of the first surface side of the first substrate, wherein the first insulating film covers the third substrate, and wherein the second insulating film does not overlap with the third substrate in the plan view.

5. The sensor device according to claim 1, wherein the first substrate is part of a set of stacked substrates stacked in a thickness direction.

6. The sensor device according to claim 1, further comprising:

a color filter provided on a second surface side of the first substrate opposite the first surface side of the first substrate.

7. The sensor device according to claim 1, wherein the second substrate has a thickness of 10 μm or more and 200 μm or less.

8. The sensor device according to claim 1, wherein the second insulating film has a thickness of 10 μm or less.

9. An electronic apparatus, comprising:

an optical part; and a sensor device to receive, light that has been transmitted through the optical part, the sensor device including:

a first substrate comprising an image sensor;

a second substrate comprising a logic circuit for processing signals from the image sensor, the second substrate being provided on a first surface side of the first substrate;

a first insulating film that is provided on the first surface side of the first substrate and that covers at least a side surface of the second substrate; and a second insulating film that is formed of a material different from that of the first insulating film and that is disposed in the first insulating film on a side of the first insulating film opposite the second substrate, wherein the second insulating film does not overlap second substrate in a plan view.

10. The electronic apparatus according to claim 9, wherein a surface of the second substrate and a surface of the second insulating film that are closest to one another are separated by part of the first insulating film.

11. The electronic apparatus according to claim 9, further comprising:

a support substrate in contact with the first insulating film and the second insulating film.

12. The electronic apparatus according to claim 9, further comprising:

a third substrate that is disposed on the side of the first surface side of the first substrate, wherein the first insulating film covers the third substrate, and wherein the second insulating film being does not overlap with the third substrate in the plan view.

13. The electronic apparatus according to claim 9, wherein the first substrate is part of a set of stacked substrates stacked in a thickness direction.

14. The electronic apparatus according to claim 9, further comprising:

a color filter provided on a second surface side of the first substrate opposite the first surface side of the first substrate.

15. The electronic apparatus according to claim 9, wherein the second substrate has a thickness of 10 μm or more and 200 μm or less.

16. The electronic apparatus according to claim 9, wherein the second insulating film has a thickness of 10 μm or less.

17. A vehicle control system, comprising:

an electronic apparatus, comprising:

an optical part; and a sensor device to receive light that has been transmitted through the optical part, the sensor device including:

a first substrate comprising an image sensor;

a second substrate comprising a logic circuit for processing signals from the image sensor, the second substrate being provided on a first surface side of the first substrate;

a first insulating film that is provided on the first surface side of the first substrate and that covers at least a side surface of the second substrate; and a second insulating film that is formed of a material different from that of the first insulating film and that is disposed in the first insulating film on a side of the first insulating film opposite the second substrate, wherein the second insulating film does not overlap the second substrate in a plan view.

* * * * *